United States Patent
Ichiyama et al.

(10) Patent No.: US 7,971,107 B2
(45) Date of Patent: Jun. 28, 2011

(54) CALCULATION APPARATUS, CALCULATION METHOD, PROGRAM, RECORDING MEDIUM, TEST SYSTEM AND ELECTRONIC DEVICE

(75) Inventors: Kiyotaka Ichiyama, Gyoda (JP); Masahiro Ishida, Miyagi (JP)

(73) Assignee: Advantest Corporation, Tokyo (JP)

( * ) Notice: Subject to any disclaimer, the term of this patent is extended or adjusted under 35 U.S.C. 154(b) by 227 days.

(21) Appl. No.: 12/343,505

(22) Filed: Dec. 24, 2008

(65) Prior Publication Data
US 2010/0107020 A1    Apr. 29, 2010

Related U.S. Application Data

(60) Provisional application No. 61/107,675, filed on Oct. 23, 2008.

(51) Int. Cl.
*G06F 11/00* (2006.01)
(52) U.S. Cl. ...................................................... 714/704
(58) Field of Classification Search ................ 714/700, 714/704
See application file for complete search history.

(56) References Cited

U.S. PATENT DOCUMENTS

| | | | | |
|---|---|---|---|---|
| 6,898,535 | B2 * | 5/2005 | Draving | 702/69 |
| 7,054,358 | B2 * | 5/2006 | Yamaguchi et al. | 375/226 |
| 2008/0189064 | A1 | 8/2008 | Yamaguchi et al. | |

FOREIGN PATENT DOCUMENTS

WO    2004-036231 A2    4/2004

OTHER PUBLICATIONS

Office Action for German Application No. 102009050915.1-35 mailed Mar. 24, 2001, with English translation thereof (25 pages).

* cited by examiner

*Primary Examiner* — James C Kerveros
(74) *Attorney, Agent, or Firm* — Osha Liang LLP

(57) ABSTRACT

A calculating apparatus that calculates a characteristic of a target signal, including an input section that receives a bit error or a sampling timing, and a calculating section that calculates sampling timings over a range in which the bit error rate is less than a designated value or a bit error rate at a designated sampling timing, by using a relational expression between the sampling timing and the bit error rate. A transmission model for transmitting a signal having jitter includes a random component and a deterministic component having a prescribed probability density distribution. The relational expression is achieved by substituting, as parameters, a standard deviation of a random component and a peak-to-peak value of a deterministic component in a jitter of the target signal.

11 Claims, 30 Drawing Sheets

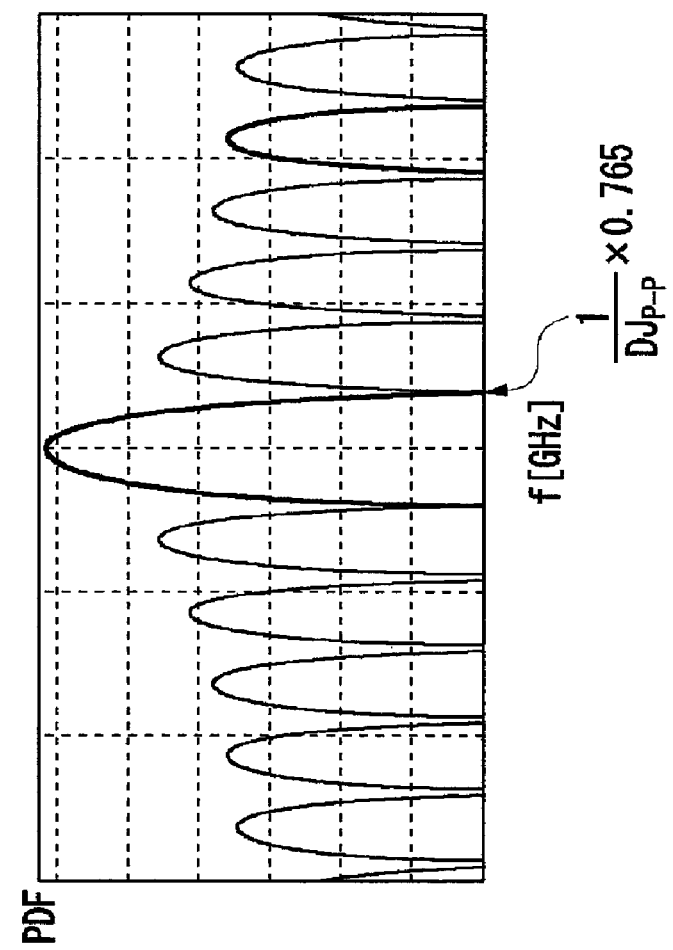
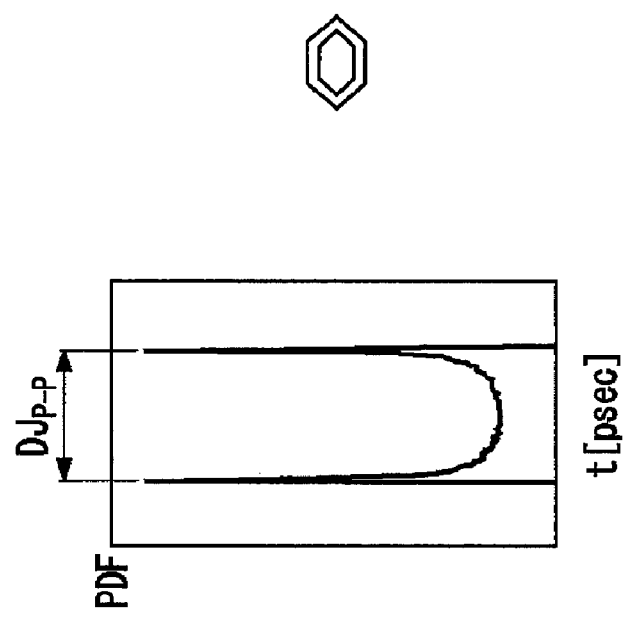
FIG. 16A

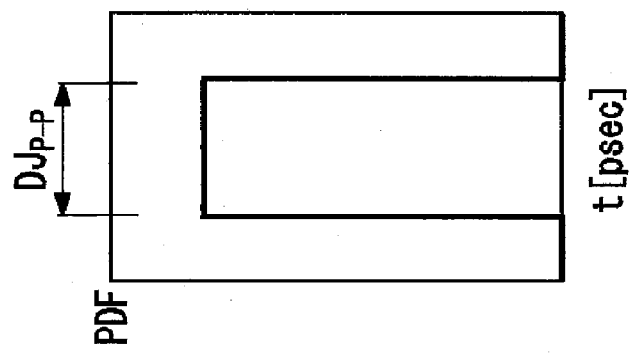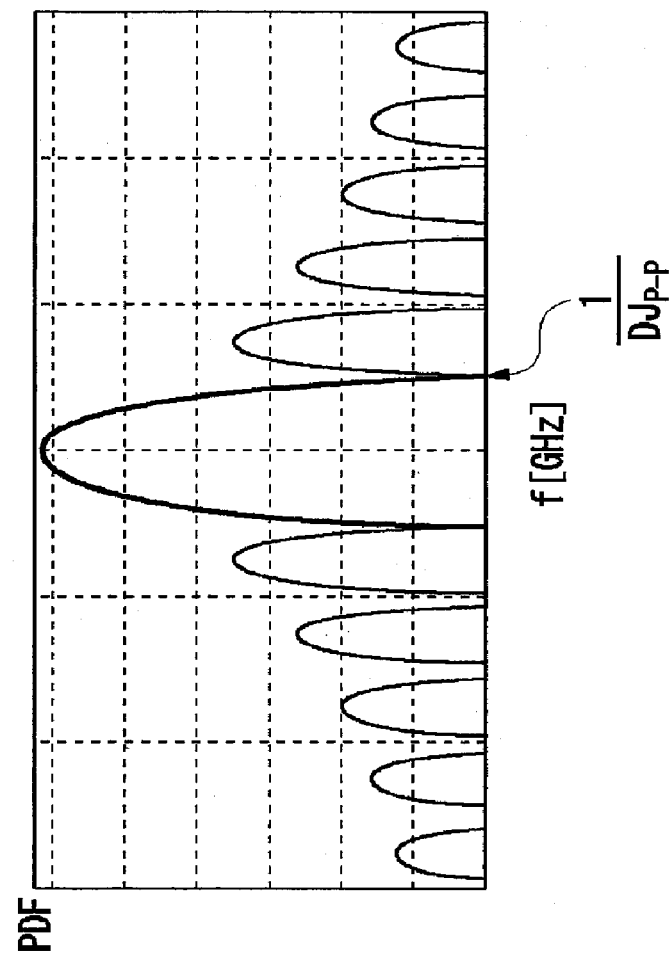
FIG. 16B

| TYPE OF DETERMINISTIC COMPONENT | PROBABILITY DENSITY FUNCTION OF THE DETERMINISTIC COMPONENT | | NULL FREQUENCY $f_{zero}$ | $\dfrac{DJ_{RMS}}{DJ_{P-P}}$ |
|---|---|---|---|---|
| | TIME DOMAIN $d(t)$ | FREQUENCY DOMAIN $D(f)$ | | |
| SINUSOIDAL DISTRIBUTION | $\dfrac{2}{\pi\sqrt{DJ_{P-P}^2 - 4t^2}}$ | $I_0(\pi \cdot DJ_{P-P} \cdot f)$ | $\dfrac{0.765}{DJ_{P-P}}$ | $\dfrac{1}{2\sqrt{2}}$ |
| TRAPEZOIDAL DISTRIBUTION | $\dfrac{\alpha \cdot DJ_{P-P}/2 < \lvert t \rvert < DJ_{P-P}/2}{\dfrac{2DJ_{P-P}^2 - 4\lvert t \rvert}{DJ_{P-P}^2(1-\alpha^2)}}$ $\dfrac{\alpha \cdot DJ_{P-P}/2 > \lvert t \rvert}{\dfrac{2}{DJ_{P-P}(1+\alpha)}}$ | $\mathrm{sinc}\left(\dfrac{(1+\alpha)}{2} \cdot DJ_{P-P} \cdot f\right) \cdot \mathrm{sinc}\left(\dfrac{(1-\alpha)}{2} \cdot DJ_{P-P} \cdot f\right)$ | $\dfrac{2}{(1+\alpha) \cdot DJ_{P-P}}$ | $\sqrt{\dfrac{1+\alpha^2}{24}}$ |
| DUAL DIRAC DISTRIBUTION | $\dfrac{\delta\left(t + \dfrac{DJ_{P-P}}{2}\right) + \delta\left(t - \dfrac{DJ_{P-P}}{2}\right)}{2}$ | $\cos(\pi \cdot DJ_{P-P} \cdot f)$ | $\dfrac{1}{2 \cdot DJ_{P-P}}$ | $\dfrac{1}{2}$ |
| DIRAC DISTRIBUTION | $\delta(t)$ | Constant, 1 | No null frequency | undefined ($DJ_{RMS}=0$, $DJ_{P-P}=0$) |

FIG. 18

CALCULATION APPARATUS, CALCULATION METHOD, PROGRAM, RECORDING MEDIUM, TEST SYSTEM AND ELECTRONIC DEVICE

CROSS REFERENCE TO RELATED APPLICATION

The present application claims priority from a provisional application No. 61/107,675 filed on Oct. 23, 2008, the contents of which are incorporated herein by reference.

BACKGROUND

1. Technical Field

The present invention relates to a calculating apparatus, a calculating method, a program, a recording medium, a test system, and an electronic device.

2. Related Art

Conventional evaluations of transmission systems involve measuring a range, e.g. eye aperture, over which a signal that is serially transmitted has a bit error rate that is less than a prescribed value. A known technique for measuring this eye aperture involves estimating the peak-to-peak value of jitter with a condition of the bit error rate being less than the prescribed value, and subtracting the estimated peak-to-peak value from an average value of the bit intervals of the signal being measured.

The peak-to-peak value $TJ_{P-P}$ of the jitter with the condition of the bit error rate being less than the prescribed value is expressed below in Expression 100.

$$TJ_{P-P} = DJ_{P-P} + (N \times \sigma_{RJ,RMS}) \qquad 100$$

In Expression 100, $\sigma_{RJ,RMS}$ represents the standard deviation of the random component of the jitter in the signal being measured, $DJ_{P-P}$ represents the peak-to-peak value of the deterministic component of the jitter in the signal being measured, and N represents a parameter that depends on the value of the bit error rate. When the bit error rate is $10^{-12}$, N=14.07, for example.

Expression 100 expresses the peak-to-peak value of all of the jitter in a transmission model in which the probability density distribution of the deterministic component in the jitter is a dual Dirac distribution and the deterministic component is sufficiently larger than the random component. Accordingly, the peak-to-peak value of the jitter calculated using Expression 100 has an error that increases the further the transmission model of the signal being measured differs from the conditions assumed for Expression 100.

SUMMARY

Therefore, it is an object of an aspect of the innovations herein to provide a calculating apparatus, a calculating method, a program, a recording medium, a test system, and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary calculating apparatus may include a calculating apparatus that calculates a characteristic of a target signal, comprising a designating section that receives a designation of either a bit error rate or a sampling timing; and a calculating section that calculates a range of sampling timings over which the bit error rate is less than a designated value or a bit error rate at a designated sampling timing by using a relational expression between the sampling timing and the bit error rate in a transmission model for transmitting a signal having jitter that includes a random component and a deterministic component having a prescribed probability density distribution, the relational expression achieved by substituting, as parameters, a standard deviation of a random component in jitter of the target signal and a peak-to-peak value of a deterministic component in the jitter of the target signal.

According to a second aspect related to the innovations herein, one exemplary calculating apparatus may include a calculating apparatus that calculates a characteristic of a target signal, comprising a designating section that receives a designation of either a bit error rate or an amplitude value; and a calculating section that calculates a range of amplitude values over which the bit error rate is less than a designated value or a bit error rate at the designated amplitude value by using a relational expression between the amplitude value and the bit error rate in a transmission model for transmitting a signal having amplitude noise that includes a random component and a deterministic component having a prescribed probability density distribution, the relational expression achieved by substituting, as parameters, a standard deviation of a random component in amplitude noise of the target signal and a peak-to-peak value of a deterministic component in the amplitude noise of the target signal.

According to a third aspect related to the innovations herein, one exemplary calculating method may include a method for calculating a characteristic of a target signal, comprising receiving a designation of either a bit error rate or a sampling timing; and calculating a range of sampling timings over which the bit error rate is less than a designated value or a bit error rate at a designated sampling timing by using a relational expression between the sampling timing and the bit error rate in a transmission model for transmitting a signal having jitter that includes a random component and a deterministic component having a prescribed probability density distribution, the relational expression achieved by substituting, as parameters, a standard deviation of a random component in jitter of the target signal and a peak-to-peak value of a deterministic component in the jitter of the target signal.

According to a fourth aspect related to the innovations herein, one exemplary calculating method may include a method for calculating a characteristic of a target signal, comprising receiving a designation of either a bit error rate or an amplitude value; and calculating a range of amplitude values over which the bit error rate is less than a designated value or a bit error rate at the designated amplitude value by using a relational expression between the amplitude value and the bit error rate in a transmission model for transmitting a signal having amplitude noise that includes a random component and a deterministic component having a prescribed probability density distribution, the relational expression achieved by substituting, as parameters, a standard deviation of a random component in amplitude noise of the target signal and a peak-to-peak value of a deterministic component in the amplitude noise of the target signal.

According to a fifth aspect related to the innovations herein, one exemplary recording medium may include a recording medium storing thereon a program that causes a computer to function as a calculating apparatus that calculates a characteristic of a target signal, the program causing the computer to function as a designating section that receives a designation of either a bit error rate or a sampling timing; and a calculating section that calculates a range of sampling timings over which the bit error rate is less than a designated value or a bit error rate at the designated sampling timing by using a relational expression between the sampling timing and the bit error rate in a transmission model for transmitting a signal having jitter that includes a random component and a deterministic component having a prescribed probability density distribution, the relational expression achieved by substituting, as parameters, a standard deviation of a random component in jitter of the target signal and a peak-to-peak value of a deterministic component in the jitter of the target signal.

According to a sixth aspect related to the innovations herein, one exemplary recording medium may include a recording medium storing thereon a program that causes a computer to function as a calculating apparatus that calculates a characteristic of a target signal, the program causing the computer to function as a designating section that receives a designation of either a bit error rate or an amplitude value; and a calculating section that calculates a range of amplitude values over which the bit error rate is less than a designated value or a bit error rate at a designated amplitude value by using a relational expression between the amplitude value and the bit error rate in a transmission model for transmitting a signal having amplitude noise that includes a random component and a deterministic component having a prescribed probability density distribution, the relational expression achieved by substituting, as parameters, a standard deviation of a random component in amplitude noise of the target signal and a peak-to-peak value of a deterministic component in the amplitude noise of the target signal.

According to a seventh aspect related to the innovations herein, one exemplary test system may include a test system that tests a device under test, comprising a measuring section that measures, a plurality of times, jitter of a target signal output by the device under test; a calculating apparatus that calculates a characteristic of the target signal; and an acceptability judging section that judges acceptability of the device under test based on the characteristic calculated by the calculating apparatus. The calculating apparatus includes a model identifying section that identifies a type of probability density distribution of a deterministic component in the jitter of the target signal, based on a probability density function of the jitter of the target signal; a parameter calculating section that calculates a standard deviation of a random component in the jitter of the target signal and a peak-to-peak value of the deterministic component in the jitter of the target signal, based on the probability density function of the jitter of the target signal; a designating section that receives a designation of either a bit error rate or a sampling timing; and a calculating section that calculates a range of sampling timings over which the bit error rate is less than a designated value or a bit error rate at the designated sampling timing by using a relational expression between the sampling timing and the bit error rate in a transmission model for transmitting a signal having jitter that includes a random component and a deterministic component having a prescribed probability density distribution, the relational expression achieved by substituting, as parameters, the standard deviation of the random component in the jitter of the target signal and the peak-to-peak value of the deterministic component in the jitter of the target signal.

According to an eighth aspect related to the innovations herein, one exemplary test system may include a test system that tests a device under test, comprising a measuring section that measures, a plurality of times, amplitude noise of a target signal output by the device under test; a calculating apparatus that calculates a characteristic of the target signal; and an acceptability judging section that judges acceptability of the device under test based on the characteristic calculated by the calculating apparatus. The calculating apparatus includes a model identifying section that identifies a type of probability density distribution of a deterministic component in the amplitude noise of the target signal, based on a probability density function of the amplitude noise of the target signal; a parameter calculating section that calculates a standard deviation of a random component in the amplitude noise of the target signal and a peak-to-peak value of the deterministic component in the amplitude noise of the target signal, based on the probability density function of the amplitude noise of the target signal; a designating section that receives a designation of either a bit error rate or a amplitude value; and a calculating section that calculates a range of amplitude values over which the bit error rate is less than a designated value or a bit error rate at the designated amplitude value by using a relational expression between the amplitude value and the bit error rate in a transmission model for transmitting a signal having amplitude noise that includes a random component and a deterministic component having a prescribed probability density distribution, the relational expression achieved by substituting, as parameters, the standard deviation of the random component in the amplitude noise of the target signal and the peak-to-peak value of the deterministic component in the amplitude noise of the target signal.

According to a ninth aspect related to the innovations herein, one exemplary electronic device may include an electronic device that generates a target signal, comprising an operation circuit that generates and outputs the target signal; a measuring section that measures, a plurality of times, jitter of the target signal output by the operation circuit; a calculating apparatus that calculates a characteristic of the target signal; and an acceptability judging section that judges acceptability of the operation circuit based on the characteristic calculated by the calculating apparatus. The calculating apparatus includes a model identifying section that identifies a type of probability density distribution of a deterministic component in the jitter of the target signal, based on a probability density function of the jitter of the target signal; a parameter calculating section that calculates a standard deviation of a random component in the jitter of the target signal and a peak-to-peak value of the deterministic component in the jitter of the target signal, based on the probability density function of the jitter of the target signal; a designating section that receives a designation of either a bit error rate or a sampling timing; and a calculating section that calculates a range of sampling timings over which the bit error rate is less than a designated value or a bit error rate at the designated sampling timing by using a relational expression between the sampling timing and the bit error rate in a transmission model for transmitting a signal having jitter that includes a random component and a deterministic component having a prescribed distribution, the relational expression achieved by substituting, as parameters, the standard deviation of the random component in the jitter of the target signal and the peak-to-peak value of the deterministic component in the jitter of the target signal.

According to a tenth aspect related to the innovations herein, one exemplary electronic device may include an electronic device that generates a target signal, comprising an operation circuit that generates and outputs the target signal; a measuring section that measures, a plurality of times, amplitude noise of the target signal output by the operation circuit; a calculating apparatus that calculates a characteristic of the target signal; and an acceptability judging section that judges acceptability of the operation circuit based on the characteristic calculated by the calculating apparatus. The calculating apparatus includes a model identifying section that identifies a type of probability density distribution of a deterministic component in the amplitude noise of the target signal, based on a probability density function of the amplitude noise of the target signal; a parameter calculating section that calculates a standard deviation of a random component in the amplitude noise of the target signal and a peak-to-peak value of the deterministic component in the amplitude noise of the target signal, based on the probability density function of the amplitude noise of the target signal; a designating section that receives a designation of either a bit error rate or a amplitude value; and a calculating section that calculates a range of amplitude values over which the bit error rate is less than a designated value or a bit error rate at the designated amplitude value by using a relational expression between the amplitude value and the bit error rate in a transmission model for transmitting a signal having amplitude noise that includes a random component and a deterministic component having a prescribed probability density distribution, the relational expression achieved by substituting, as parameters, the standard deviation of the random component in the amplitude noise of the target signal and the peak-to-peak value of the deterministic component in the amplitude noise of the target signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 16A shows the probability density function and the spectrum of a deterministic component having a sinusoidal distribution model.

FIG. 16B shows the probability density function and the spectrum of a deterministic component having a uniform distribution model.

FIG. 18 shows a chart showing a time domain model, a frequency domain model, a relation between the first null frequency $f_{zero}$ and the peak-to-peak value $DJ_{P-P}$, and the relationship between the peak-to-peak value $DJ_{P-P}$ and a root mean squared value $DJ_{RMS}$, for each type of deterministic component.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
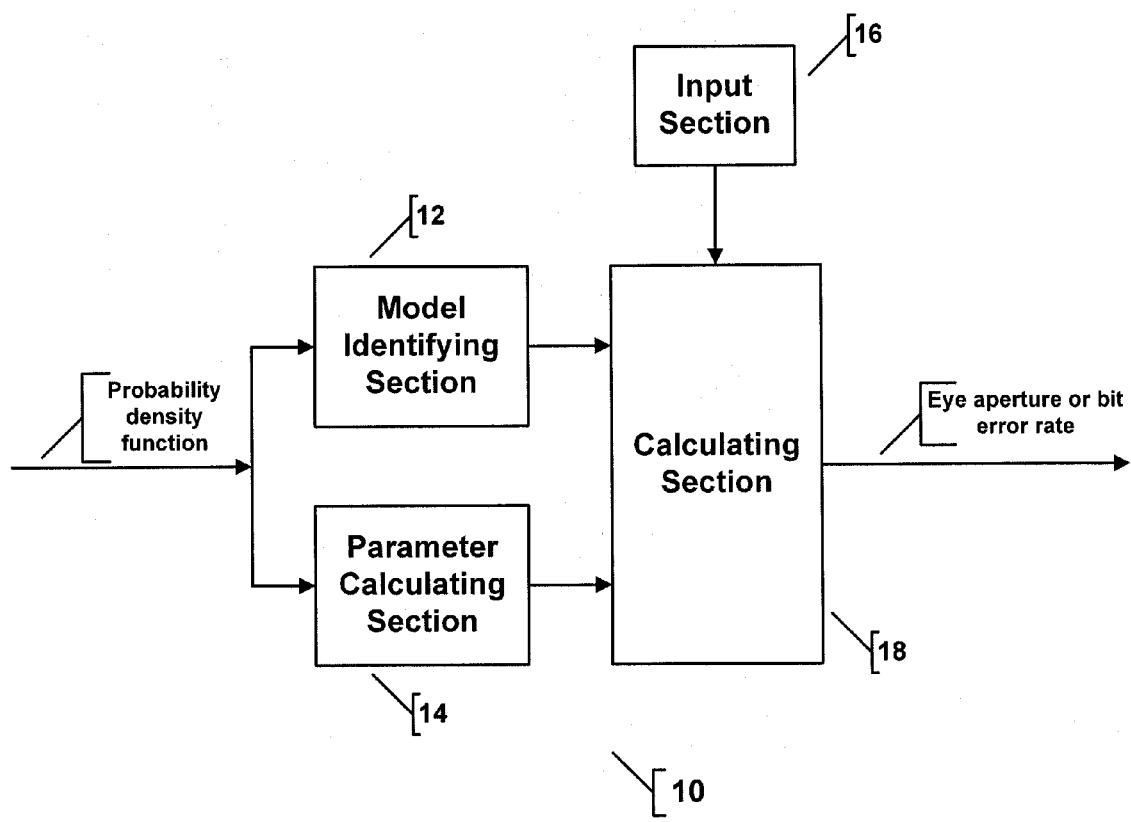
FIG. 1 shows an exemplary functional configuration of a calculating apparatus 10 according to an embodiment of the present invention.

FIG. 1 shows an exemplary functional configuration of a calculating apparatus 10 according to an embodiment of the present invention. The calculating apparatus 10 calculates a characteristic of a target signal, such as an electric signal transmitted by an electric circuit or an optical signal transmitted by an optical circuit. In the present embodiment, the calculating apparatus 10 is provided with a probability density function expressing a distribution of jitter in the target signal, and calculates a range of sampling timings over which a bit error rate is less than or equal to a designated value, i.e. an eye aperture in a time direction, or calculates a bit error rate at a designated sampling timing.

The jitter is the phase noise of the target signal. More specifically, the jitter may be the time difference between the edge timing of the target signal and the ideal edge timing. The probability density function may be a function expressing a measured value distribution acquired by measuring the jitter a plurality of times. For example, the probability density function is a function expressing the distribution of values obtained by measuring the jitter at each edge of the target signal.

Here, the jitter of the target signal includes a random component that is generated randomly and a deterministic component that occurs periodically due to the characteristic of the transmission line of the target signal or the like. The random component in the jitter is expressed by a Gaussian distribution. The deterministic component included in the jitter is expressed by a distribution model whose type corresponds to the reason for the deterministic component generation. The types of deterministic component distribution models may include a dual Dirac distribution, a uniform distribution, a trapezoidal distribution, and the like.

The calculating apparatus 10 is provided with a model identifying section 12, a parameter calculating section 14, a designating section 16, and a calculating section 18. The model identifying section 12 determines the type of probability density distribution of the deterministic component included in the jitter of the target signal based on the probability density function of the jitter in the target signal.

For example, the model identifying section 12 determines the type of the probability density distribution of the deterministic component included in the jitter of the target signal to be a dual Dirac distribution, a uniform distribution, or a trapezoidal distribution. In the case of a trapezoidal distribution, the model identifying section 12 may also determine the ratio of the length of the top portion of the trapezoid to the length of the bottom portion of the trapezoid, i.e. a trapezoid ratio. The model identifying section 12 may be realized as the deterministic component identifying apparatus 100 described in relation to FIGS. 13 to 26.

The parameter calculating section 14 calculates a peak-to-peak value of the deterministic component in the jitter of the target signal and a standard deviation of the random component in the jitter of the target signal, based on the probability density function of the jitter of the target signal. The peak-to-peak value of the deterministic component in the jitter of the target signal represents the range of jitter in the probability density distribution of the deterministic component. For example, if the deterministic component of the jitter is distributed in a positive and negative direction with the ideal edge timing as a base, the peak-to-peak value of the deterministic component is the distance, i.e. time width, obtained by adding (i) the maximum distance of the jitter in a negative direction from the ideal edge timing and (ii) the maximum distance of the jitter in a positive direction from the ideal edge timing. The parameter calculating section 14 may be realized as the deterministic component identifying apparatus 100 described in relation to FIGS. 13 to 26.

The designating section 16 receives a designation for either a bit error rate or a sampling timing. For example, the designating section 16 receives this designation from a user. The designating section 16 may instead receive this designation by reading a bit error rate or a sampling timing stored in advance in a memory or the like.

The calculating section 18 receives, from the model identifying section 12, the types of probability density distributions of the deterministic component in the jitter of the target signal. For example, the calculating section 18 may receive a dual Dirac distribution, a uniform distribution, and a trapezoidal distribution as the types of probability density distributions of the deterministic component. In the case of the trapezoidal distribution, the calculating section 18 may also receive the trapezoid ratio. The calculating section 18 may receive parameters from the parameter calculating section 14. The parameters may be the standard deviation of the random component in the jitter of the target signal and the peak-to-peak value of the deterministic component in the jitter of the target signal.

The calculating section 18 also acquires a relational expression between the bit error rate and the sampling timing, which can be obtained by substituting, as parameters, the standard deviation of the random component in the jitter of the target signal and the peak-to-peak value of the deterministic component in the jitter of the target signal. In this case, the calculating section 18 acquires a relational expression between the sampling timing and the bit error rate in a transmission model for transmitting a signal having jitter that includes a random component and a deterministic component having a prescribed probability density distribution. More specifically, the calculating section 18 acquires a relational expression between the sampling timing and the bit error rate in a transmission model for transmitting a signal having jitter that includes a random component and a deterministic component having the received type of probability density distribution. The relational expression is described in detail further below.

The calculating section 18 uses the acquired relational expression to calculate the range of sampling timings over which the bit error rate is less than or equal to a designated value, i.e. the eye aperture in the time direction, or the bit error rate at the designated sampling timing. If the bit error rate is designated, the calculating section 18 may use the acquired relational expression to calculate the range of sampling timings over which the bit error rate is less than or equal to a designated value in the target signal. If the sampling timing is designated, the calculating section 18 may use the relational expression to calculate the bit error rate at the designated timing in the target signal. The calculating apparatus 10 having the above configuration can accurately calculate (i) the range of sampling timings over which the bit error rate is less than or equal to a designated value and (ii) the bit error rate at a designated sampling timing.

As another example, the calculating apparatus 10 may be provided with the probability density function representing the probability density distribution of the amplitude noise of the target signal, and calculate the bit error rate at a designated amplitude value or a range of amplitude values over which the bit error rate is less than or equal to a designated value, i.e. an eye aperture in an amplitude direction. The components of the calculating apparatus 10 according to this example have functions that differ in the following ways.

The model identifying section 12 identifies the type of probability density distribution of the deterministic component in the amplitude noise of the target signal based on the probability density function of the amplitude noise of the target signal. The amplitude noise may be the difference in amplitude between the amplitude of the target signal and a threshold value of the ideal amplitude for identifying a bit value. In this case, the probability density function may be a function representing a measured value distribution obtained by measuring the amplitude noise a plurality of times. For example, the probability density function may be a function representing the distribution of values obtained by measuring the amplitude noise at each bit of the target signal.

The parameter calculating section 14 calculates the standard deviation of the random component in the amplitude noise of the target signal and the peak-to-peak value of the deterministic component in the amplitude noise of the target signal, based on the probability density function of the amplitude noise of the target signal. The peak-to-peak value of the deterministic component in the amplitude noise of the target signal represents the range of amplitude noise in the probability density distribution of the deterministic component. For example, if the deterministic component of the amplitude noise is distributed in a positive and negative direction with the ideal threshold value as a base, the peak-to-peak value of the deterministic component is the distance, i.e. amplitude amount, obtained by adding (i) the maximum distance of the amplitude noise in a negative direction from the ideal threshold value and (ii) the maximum distance of the amplitude noise in a positive direction from the ideal threshold value.

The designating section 16 receives a designation for either a bit error rate or an amplitude value. The calculating section 18 receives the types of probability density distributions of the deterministic component in the amplitude noise of the target signal, and also receives, as parameters, the standard deviation of the random component in the amplitude noise of the target signal and the peak-to-peak value of the deterministic component in the amplitude noise of the target signal. The calculating section 18 acquires a relational expression between the bit error rate and the amplitude value, which can be obtained by substituting the standard deviation of the random component in the amplitude noise of the target signal and the peak-to-peak value of the deterministic component in the amplitude noise of the target signal as parameters. The relational expression acquired by the calculating section 18 in the previous example used a parameter expressing a sampling timing, but the calculating section 18 of the present example uses a parameter expressing an amplitude value instead, and is the same in all other respects.

The calculating section 18 uses the acquired relational expression to calculate the range of amplitude values over which the bit error rate is less than or equal to a designated value, i.e. the eye aperture in the amplitude direction, or the bit error rate at the designated amplitude value. The calculating apparatus 10 having the above configuration can accurately calculate (i) the range of amplitude values over which the bit error rate is less than or equal to a designated value or (ii) the bit error rate at a designated amplitude value.

Figure 2:
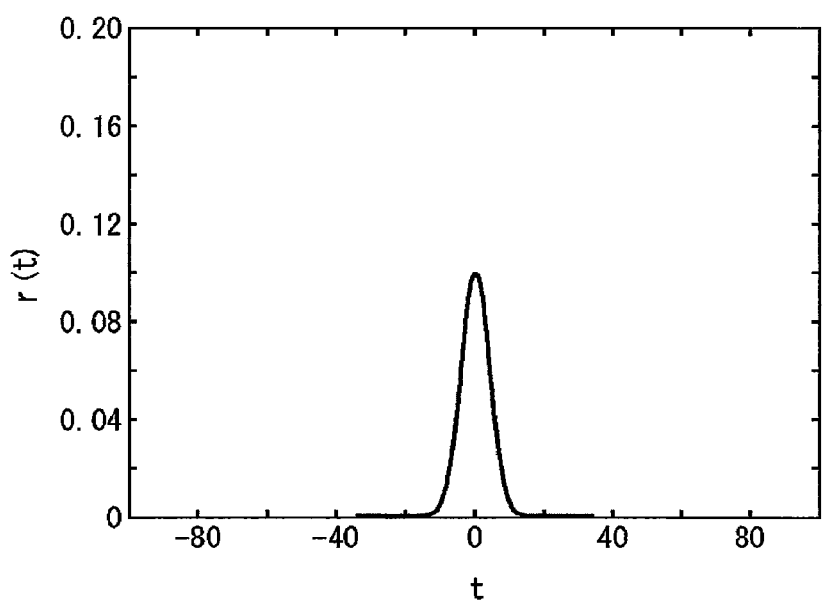
FIG. 2 shows an example of a probability density function of a Gaussian distribution.
Figure 3:
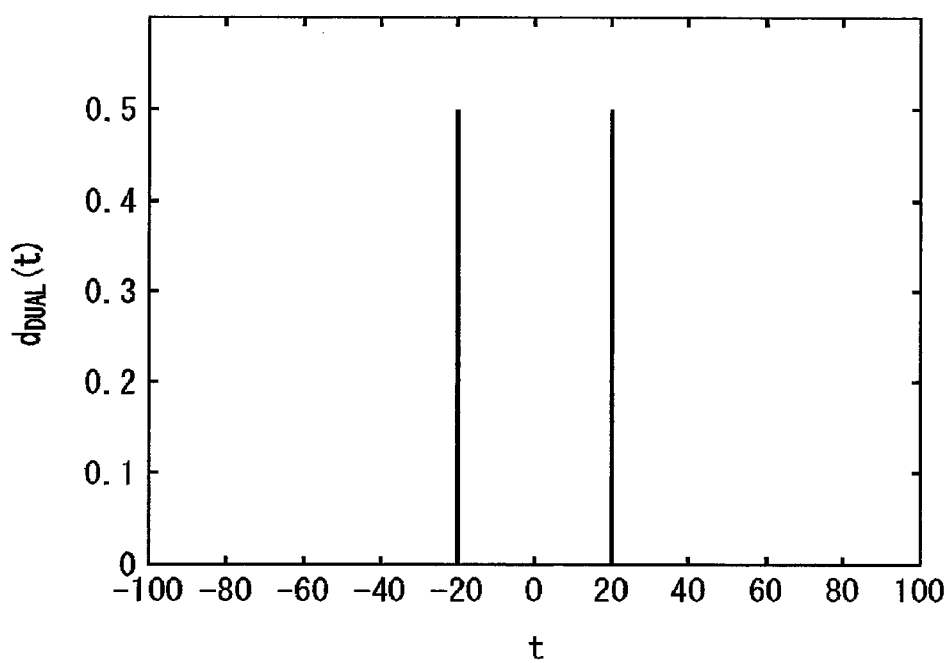
FIG. 3 shows an example of a probability density function of a dual Dirac distribution.
Figure 4:
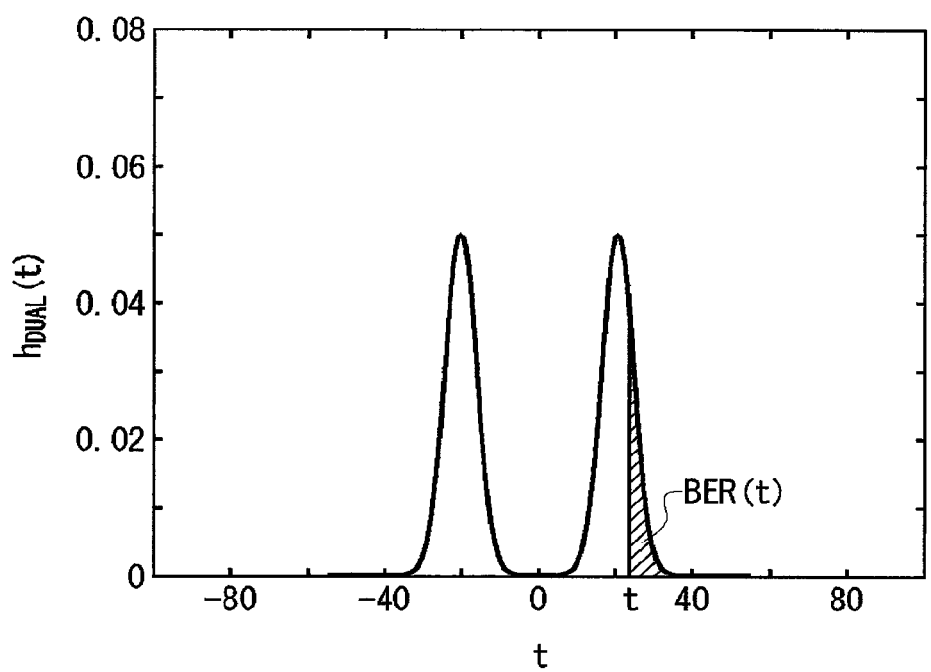
FIG. 4 shows an example of a probability density function of jitter including a random component and a deterministic component having a dual Dirac distribution.

FIG. 2 shows an example of a probability density function of a Gaussian distribution. FIG. 3 shows an example of a probability density function of a dual Dirac distribution. FIG. 4 shows an example of a probability density function of jitter including a random component and a deterministic component having a dual Dirac distribution. In FIGS. 2 to 4, the horizontal axes represent sampling timings t, the vertical axes represent the respective probability densities, and the probability density functions are set such that the average distribution is at the sampling timing t=0.

The random component in the jitter follows the Gaussian distribution shown in FIG. 2. The distribution of the random component is expressed by the Gaussian distribution probability density function r(t) shown below in Expression 101.

$$r(t) = \frac{1}{\sqrt{2\pi}\,\sigma_{RJ,RMS}} \exp\left(-\frac{t^2}{2\sigma_{RJ,RMS}^2}\right) \quad (101)$$

Here, t represents the sampling timing, and $\sigma_{RJ,RMS}$ represents the standard deviation of the random component. This representation is the same for the following expressions.

The dual Dirac distribution is represented by a probability density function such as that shown in FIG. 3. The dual Dirac function can be expressed by Expression 102 below.

$$d_{DUAL}(t) = \frac{\delta\left(t + \frac{DJ_{P-P}}{2}\right) + \delta\left(t - \frac{DJ_{P-P}}{2}\right)}{2} \quad (102)$$

Here, $DJ_{P-P}$ represents the peak-to-peak value of the deterministic component. This representation is the same for the following expressions.

The distribution of the jitter including the random component and the deterministic component having the dual Dirac distribution is expressed by a function resulting from a convolution of the probability density function of the Gaussian distribution and the probability density function of the dual Dirac distribution, as shown in FIG. 4. The probability density function of the jitter including the random component and the deterministic component having the dual Dirac distribution is expressed by Expression 103 below.

$$h_{DUAL}(t) = r(t) \otimes d_{DUAL}(t) = \int_{-\infty}^{\infty} r(t-\tau)d_{DUAL}(\tau)d\tau \quad (103)$$

$$= \frac{1}{2\sqrt{2\pi}\,\sigma_{RJ,RMS}} \exp\left(-\frac{\left(t - \frac{DJ_{P-P}}{2}\right)^2}{2\sigma_{RJ,RMS}^2}\right) +$$

$$\frac{1}{2\sqrt{2\pi}\,\sigma_{RJ,RMS}} \exp\left(-\frac{\left(t + \frac{DJ_{P-P}}{2}\right)^2}{2\sigma_{RJ,RMS}^2}\right)$$

Figure 5:
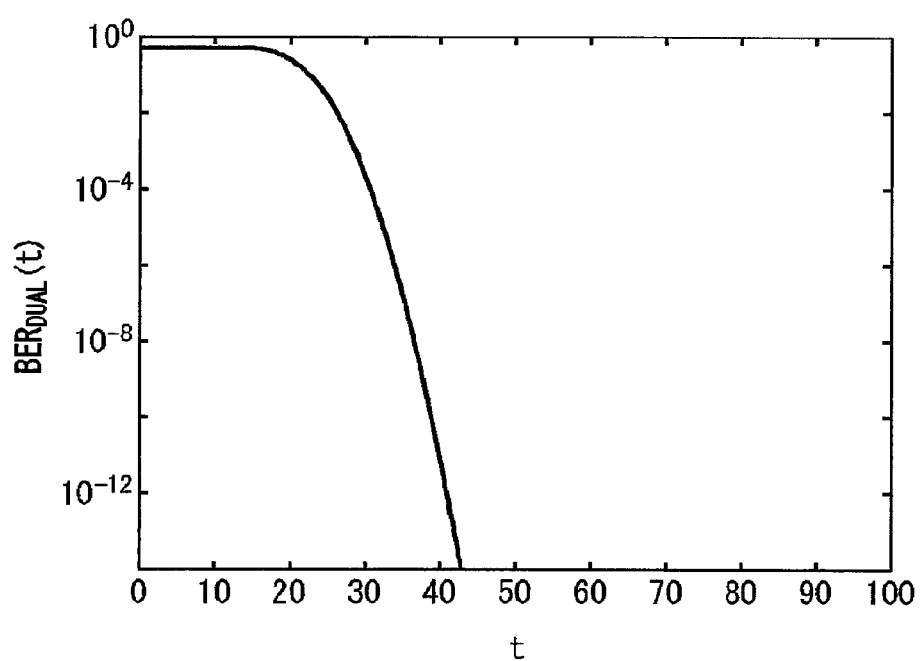
FIG. 5 shows an example of the bit error rate of a signal having jitter that includes a random component and a deterministic component having a dual Dirac distribution.

FIG. 5 shows an example of the bit error rate of a signal having jitter that includes a random component and a deterministic component having a dual Dirac distribution. The bit error rate at a sampling timing (t) in the signal having jitter that includes the random component and the deterministic component having the dual Dirac distribution is expressed by a function obtained by integrating, from t to infinity, a function obtained as the convolution of the probability density function of a Gaussian distribution and the probability density function of the dual Dirac distribution. This bit error rate ($BER_{DUAL}(t)$) is expressed by Expression 104 below.

$$BER_{DUAL}(t) = \qquad (104)$$

$$0.5 - \frac{1}{2\sqrt{2\pi}\,\sigma_{RJ,RMS}} \left[ \int_0^1 \exp\left(-\frac{\left(t - \frac{DJ_{P-P}}{2}\right)^2}{2\sigma_{RJ,RMS}^2}\right) d\tau + \int_0^1 \exp\left(-\frac{\left(t + \frac{DJ_{P-P}}{2}\right)^2}{2\sigma_{RJ,RMS}^2}\right) d\tau \right]$$

Here, the error function erf(x) is defined as shown below, and is the same for all of the following expressions.

$$\mathrm{erf}(x) = \frac{2}{\sqrt{\pi}} \int_0^x \exp(-t^2)\,dt$$

Using the error function erf(x), Expression 11 can be derived from Expression 104.

$$BER_{DUAL}(t) = 0.5 - \frac{1}{4}\left[\mathrm{erf}\left(\frac{\left(t - \frac{DJ_{P-P}}{2}\right)}{\sqrt{2}\,\sigma_{RJ,RMS}}\right) + \mathrm{erf}\left(\frac{\left(t + \frac{DJ_{P-P}}{2}\right)}{\sqrt{2}\,\sigma_{RJ,RMS}}\right)\right] \qquad (11)$$

Expression 11 expresses the relation between the sampling timing and the bit error rate in a transmission model for transmitting the signal having jitter that includes the random component and the deterministic component having the dual Dirac distribution. Accordingly, when the type of probability density distribution of the deterministic component in the jitter of the target signal is a dual Dirac distribution, the calculating section 18 may use the relational expression shown by Expression 11 to calculate the range of sampling timings over which the bit error rate is less than or equal to a designated value or the bit error rate at a designated sampling timing.

More specifically, when the type of probability density distribution of the deterministic component in the jitter of the target signal is a dual Dirac distribution and a sampling timing is designated, the calculating section 18 may calculate the bit error rate by substituting the standard deviation of the random component, the peak-to-peak value of the deterministic component, and the sampling timing into Expression 11. When the type of probability density distribution of the deterministic component in the jitter of the target signal is a dual Dirac distribution and a bit error rate is designated, the calculating section 18 may calculate the maximum value of the jitter at which the bit error rate is less than or equal to a designated value by substituting the standard deviation of the random component, the peak-to-peak value of the deterministic component, and the bit error rate into an expression approximating the inverse of Expression 11.

The calculating section 18 may then calculate the range of sampling timings over which the bit error rate is less than or equal to a designated value by subtracting double the calculated maximum jitter value, i.e. the peak-to-peak value of the jitter, from an average value of the bit intervals of the target signal. In this way, when the type of probability density distribution of the deterministic component in the jitter of the target signal is a dual Dirac distribution, the calculating apparatus 10 can accurately calculate the range of amplitude values over which the bit error rate is less than or equal to a designated value or the bit error rate at a designated amplitude value.

Figure 6:
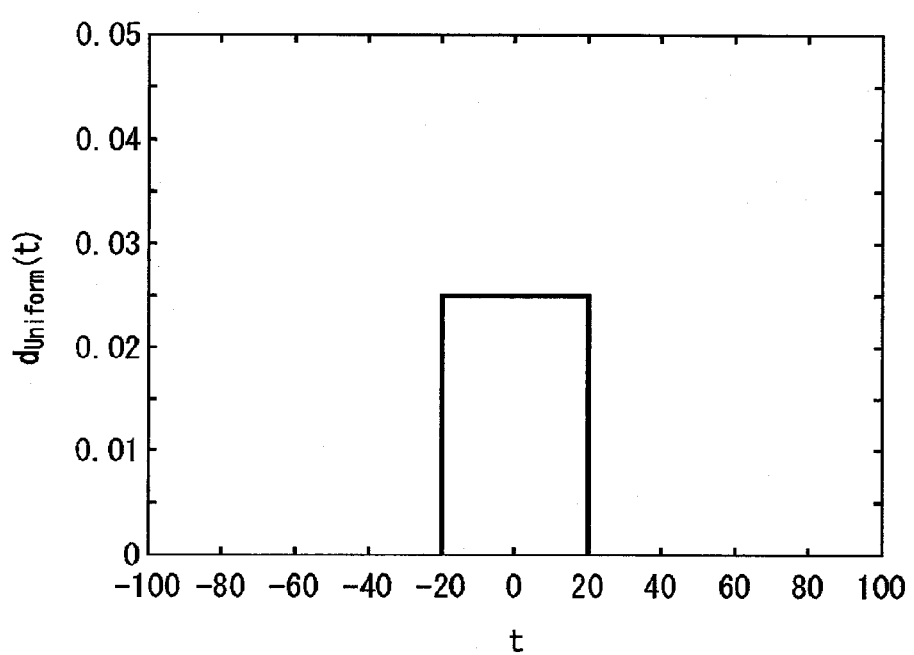
FIG. 6 shows an example of a probability density function of a uniform distribution.
Figure 7:
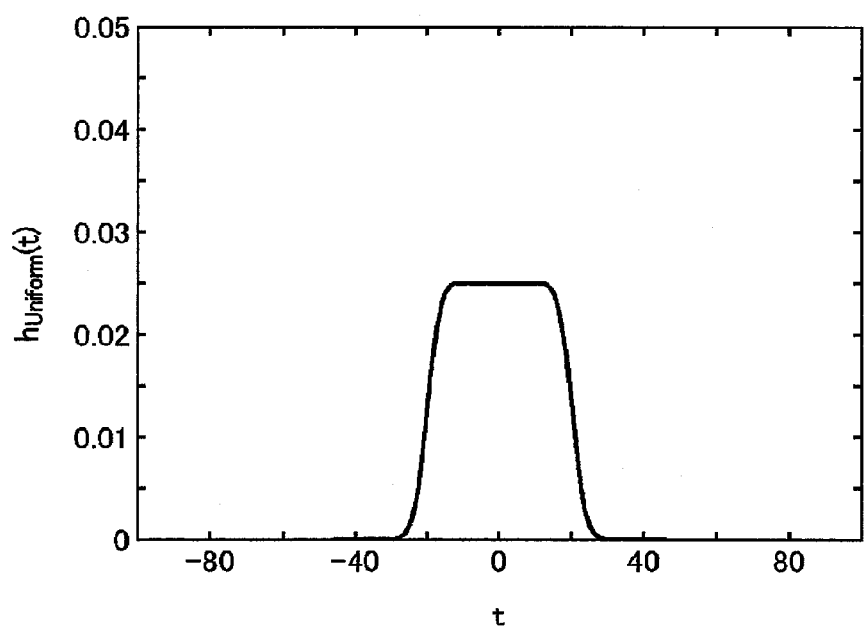
FIG. 7 shows an example of a probability density function of jitter including a random component and a deterministic component having a uniform distribution.

FIG. 6 shows an example of a probability density function of a uniform distribution. FIG. 7 shows an example of a probability density function of jitter including a random component and a deterministic component having a uniform distribution. In FIGS. 6 and 7, the horizontal axes represent sampling timings t, the vertical axes represent the respective probability densities, and the probability density functions are set such that the average distribution is at the sampling timing t=0.

The uniform distribution is represented by the probability density function shown in FIG. 6. The uniform distribution is expressed by Expression 106 below.

$$d_{Uniform}(t) = \begin{cases} \frac{1}{DJ_{P-P}} & \left(|t| < \frac{DJ_{P-P}}{2}\right) \\ 0 & \left(|t| > \frac{DJ_{P-P}}{2}\right) \end{cases} \qquad (106)$$

The distribution of the jitter including the random component and the deterministic component having the uniform distribution is expressed by a function resulting from a convolution of the probability density function of the Gaussian distribution and the probability density function of the uniform distribution, as shown in FIG. 7. The distribution of the jitter including the random component and the deterministic component having the uniform distribution is expressed by Expression 107 below.

$$h_{Uniform}(t) = \frac{1}{2DJ_{P-P}}\left[\mathrm{erf}\left(\frac{\left(t + \frac{DJ_{P-P}}{2}\right)}{\sqrt{2}\,\sigma_{RJ,RMS}}\right) - \mathrm{erf}\left(\frac{\left(t - \frac{DJ_{P-P}}{2}\right)}{\sqrt{2}\,\sigma_{RJ,RMS}}\right)\right] \qquad (107)$$

Figure 8:
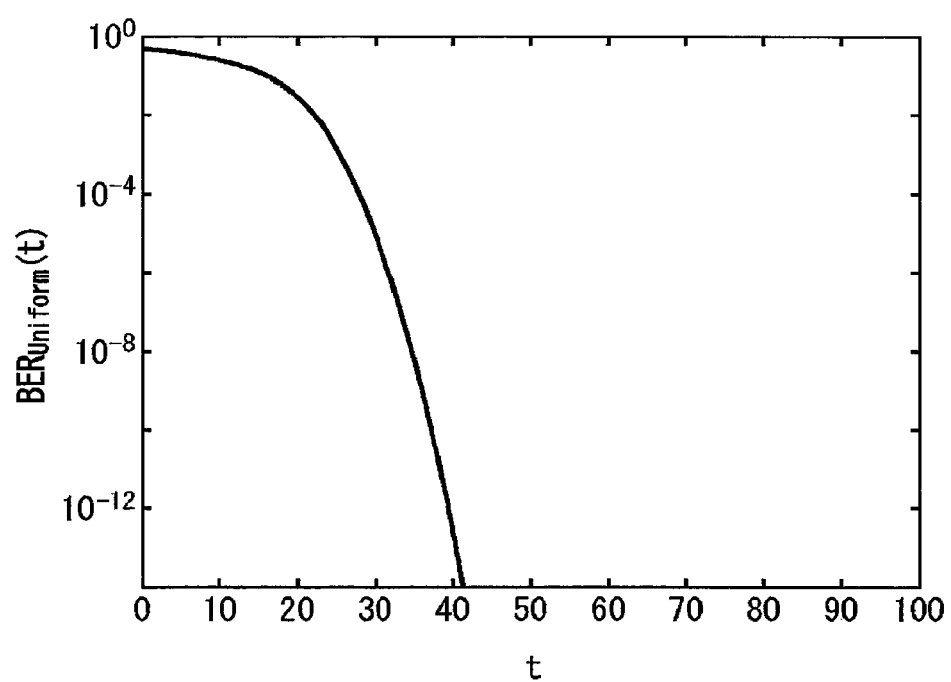
FIG. 8 shows an example of the bit error rate of a signal having jitter that includes a random component and a deterministic component having a uniform distribution.

FIG. 8 shows an example of the bit error rate of a signal having jitter that includes a random component and a deterministic component having a uniform distribution. The bit error rate ($BER_{Uniform}(t)$) at a sampling timing (t) in the signal having jitter that includes the random component and the deterministic component having the uniform distribution is expressed by a function obtained by integrating, from t to infinity, a function obtained as the convolution of the probability density function of a Gaussian distribution and the probability density function of the uniform distribution. This bit error rate ($BER_{Uniform}(t)$) is expressed by Expression 12 below.

$$BER_{Uniform}(t) = 0.5 - \frac{\sigma_{RJ,RMS}}{\sqrt{2\pi}\,DJ_{P-P}}\left[\exp\left(-\frac{\left(t + \frac{DJ_{P-P}}{2}\right)^2}{2\sigma_{RJ,RMS}^2}\right) - \exp\left(-\frac{\left(t - \frac{DJ_{P-P}}{2}\right)^2}{2\sigma_{RJ,RMS}^2}\right)\right] - \qquad (12)$$

$$\frac{1}{2DJ_{P-P}}\left[\left(t+\frac{DJ_{P-P}}{2}\right)\cdot\mathrm{erf}\left(\frac{\left(t+\frac{DJ_{P-P}}{2}\right)}{\sqrt{2}\,\sigma_{RJ,RMS}}\right)-\left(t-\frac{DJ_{P-P}}{2}\right)\cdot\mathrm{erf}\left(\frac{t-\frac{DJ_{P-P}}{2}}{\sqrt{2}\,\sigma_{RJ,RMS}}\right)\right]$$

Expression 12 expresses the relation between the sampling timing and the bit error rate in a transmission model for transmitting the signal having jitter that includes the random component and the deterministic component having the uniform distribution. Accordingly, when the type of probability density distribution of the deterministic component in the jitter of the target signal is a uniform distribution, the calculating section 18 may use the relational expression shown by Expression 12 to calculate the range of sampling timings over which the bit error rate is less than or equal to a designated value or the bit error rate at a designated sampling timing.

More specifically, when the type of probability density distribution of the deterministic component in the jitter of the target signal is a uniform distribution and a sampling timing is designated, the calculating section 18 may calculate the bit error rate by substituting the standard deviation of the random component, the peak-to-peak value of the deterministic component, and the sampling timing into Expression 12. When the type of probability density distribution of the deterministic component in the jitter of the target signal is a uniform distribution and a bit error rate is designated, the calculating section 18 may calculate the maximum value of the jitter at which the bit error rate is less than or equal to a designated value by substituting the standard deviation of the random component, the peak-to-peak value of the deterministic component, and the bit error rate into an expression approximating the inverse of Expression 12.

The calculating section 18 may then calculate the range of sampling timings over which the bit error rate is less than or equal to a designated value by subtracting double the calculated maximum jitter value, i.e. the peak-to-peak value of the jitter, from an average value of the bit intervals of the target signal. In this way, when the type of probability density distribution of the deterministic component in the jitter of the target signal is a uniform distribution, the calculating apparatus 10 can accurately calculate the range of amplitude values over which the bit error rate is less than or equal to a designated value or the bit error rate at a designated amplitude value.

Figure 9:
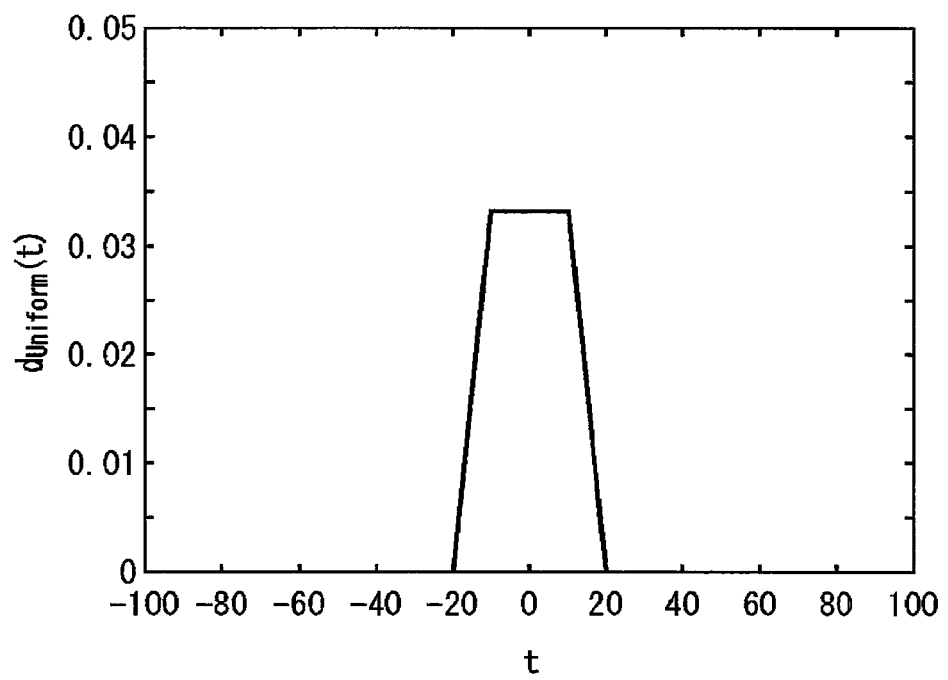
FIG. 9 shows an example of a probability density function of a trapezoidal distribution.
Figure 10:
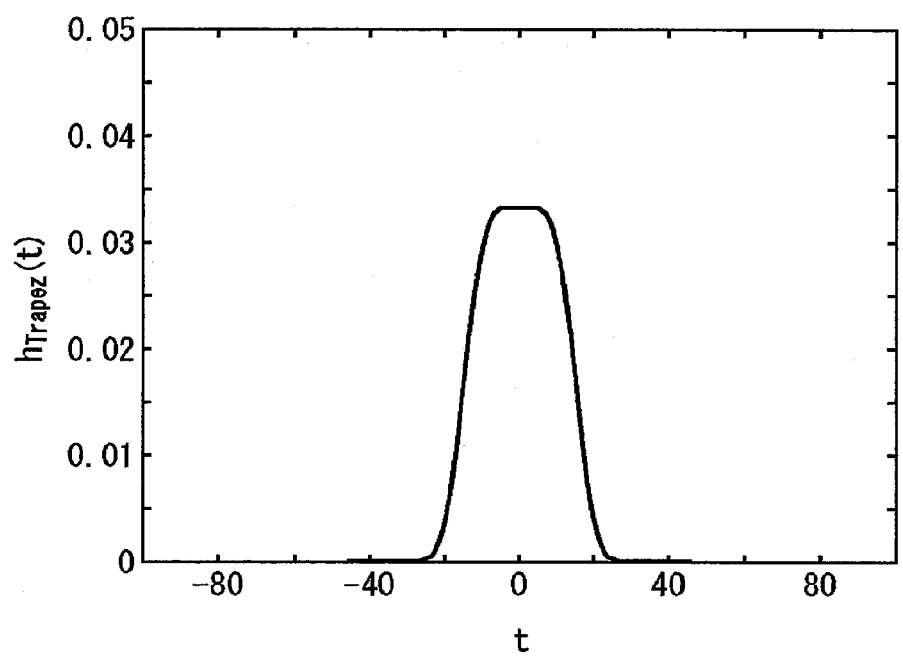
FIG. 10 shows an example of a probability density function of jitter including a random component and a deterministic component having a trapezoidal distribution with a trapezoid ratio α.

FIG. 9 shows an example of a probability density function of a trapezoidal distribution. FIG. 10 shows an example of a probability density function of jitter including a random component and a deterministic component having a trapezoidal distribution with a trapezoid ratio α. In FIGS. 9 and 10, the horizontal axes represent sampling timings t, the vertical axes represent the respective probability densities, and the probability density functions are set such that the average distribution is at the sampling timing t=0.

The trapezoidal distribution is represented by the probability density function shown in FIG. 9. The trapezoidal distribution is expressed by Expression 108 below. In Expression 108, α represents the trapezoid ratio, which is the ratio of the length of the top portion of the trapezoid to the length of the bottom portion of the trapezoid, and α is the same in the following expressions.

$$d_{Trapezoid}(t) = \begin{cases} \frac{2}{DJ_{P-P}(1+\alpha)} & \left(|t| < \alpha\frac{DJ_{P-P}}{2}\right) \\ -\frac{4}{DJ_{P-P}^2(1+\alpha^2)}|t| + \frac{2}{DJ_{P-P}(1-\alpha^2)} & \left(\alpha\frac{DJ_{P-P}}{2} < |t| < \frac{DJ_{P-P}}{2}\right) \\ 0 & \left(|t| > \alpha\frac{DJ_{P-P}}{2}\right) \end{cases} \quad (108)$$

The distribution of the jitter including the random component and the deterministic component having the trapezoidal distribution is expressed by a function resulting from a convolution of the probability density function of the Gaussian distribution and the probability density function of the trapezoidal distribution, as shown in FIG. 10. The distribution of the jitter including the random component and the deterministic component having the trapezoidal distribution with a trapezoid ratio α is expressed by Expression 109 below.

$$h_{Trapez}(t) = \frac{2\sqrt{2}\,\sigma_{RJ,RMS}}{\sqrt{\pi}\,DJ_{P-P}^2(1-\alpha^2)}\left[\exp\left(-\left(\frac{2t+DJ_{P-P}}{2\sqrt{2}\,\sigma_{RJ,RMS}}\right)^2\right)+\right.$$

$$\sqrt{\pi}\left\{\frac{2t+DJ_{P-P}}{2\sqrt{2}\,\sigma_{RJ,RMS}}\right\}\mathrm{erf}\left(\frac{2t+DJ_{P-P}}{2\sqrt{2}\,\sigma_{RJ,RMS}}\right)\right]+$$

$$\frac{2\sqrt{2}\,\sigma_{RJ,RMS}}{\sqrt{\pi}\,DJ_{P-P}^2(1-\alpha^2)}\left[\exp\left(-\left(\frac{2t-DJ_{P-P}}{2\sqrt{2}\,\sigma_{RJ,RMS}}\right)^2\right)+\right.$$

$$\sqrt{\pi}\left\{\frac{2t-DJ_{P-P}}{2\sqrt{2}\,\sigma_{RJ,RMS}}\right\}\mathrm{erf}\left(\frac{2t-DJ_{P-P}}{2\sqrt{2}\,\sigma_{RJ,RMS}}\right)\right]-$$

$$\frac{2\sqrt{2}\,\sigma_{RJ,RMS}}{\sqrt{\pi}\,DJ_{P-P}^2(1-\alpha^2)}\left[\exp\left(-\left(\frac{2t+\alpha DJ_{P-P}}{2\sqrt{2}\,\sigma_{RJ,RMS}}\right)^2\right)+\right.$$

$$\sqrt{\pi}\left\{\frac{2t+\alpha DJ_{P-P}}{2\sqrt{2}\,\sigma_{RJ,RMS}}\right\}\mathrm{erf}\left(\frac{2t+\alpha DJ_{P-P}}{2\sqrt{2}\,\sigma_{RJ,RMS}}\right)\right]-$$

$$\frac{2\sqrt{2}\,\sigma_{RJ,RMS}}{\sqrt{\pi}\,DJ_{P-P}^2(1-\alpha^2)}\left[\exp\left(-\left(\frac{2t-\alpha DJ_{P-P}}{2\sqrt{2}\,\sigma_{RJ,RMS}}\right)^2\right)+\right.$$

$$\left.\sqrt{\pi}\left\{\frac{2t-\alpha DJ_{P-P}}{2\sqrt{2}\,\sigma_{RJ,RMS}}\right\}\mathrm{erf}\left(\frac{2t-\alpha DJ_{P-P}}{2\sqrt{2}\,\sigma_{RJ,RMS}}\right)\right] \quad (109)$$

Figure 11:
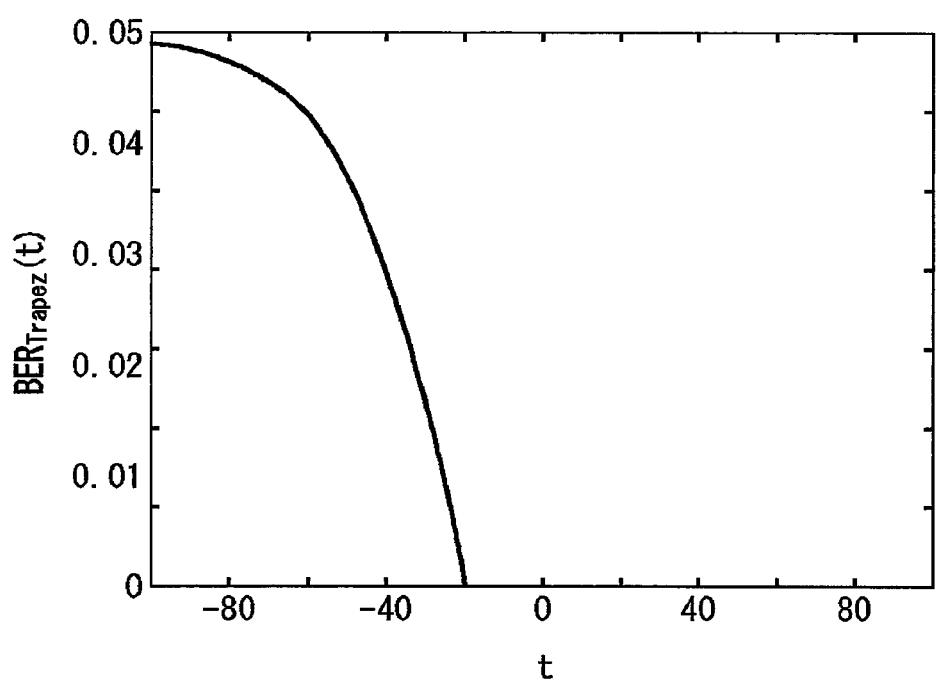
FIG. 11 shows an example of the bit error rate of a signal having jitter that includes a random component and a deterministic component having a trapezoidal distribution with a trapezoid ratio α.

FIG. 11 shows an example of the bit error rate of a signal having jitter that includes a random component and a deterministic component having a trapezoidal distribution with a trapezoid ratio α. The bit error rate $(BER_{Trapez}(t))$ at a sampling timing (t) in the signal having jitter that includes the random component and the deterministic component having the trapezoidal distribution with a trapezoid ratio α is expressed by a function obtained by integrating, from t to infinity, a function obtained as the convolution of the probability density function of a Gaussian distribution and the probability density function of the trapezoidal distribution. This bit error rate $(BER_{Trapez}(t))$ is expressed by Expression 13 below.

$$BER_{Trapez}(t) = 0.5 - f_1(t) - f_2(t) + f_3(t) + f_4(t) \quad (13)$$

In Expression 13, $f_1(t)$, $f_2(t)$, $f_3(t)$, and $f_4(t)$ are expressed as shown below.

$$f_1(t) = \frac{\left[\sigma_{RJ,RMS}(2t+DJ_{P-P})\exp\left(-\left(\frac{2t+DJ_{P-P}}{2\sqrt{2}\,\sigma_{RJ,RMS}}\right)^2\right)\right]}{\sqrt{2\pi}\,DJ_{P-P}^2(1-\alpha^2)} + \frac{\left[\begin{array}{c}4\sigma_{RJ,RMS}^2+(2t+DJ_{P-P})^2\cdot\\ \mathrm{erf}\left(\frac{2t+DJ_{P-P}}{2\sqrt{2}\,\sigma_{RJ,RMS}}\right)\end{array}\right]}{4DJ_{P-P}^2(1-\alpha^2)}$$

$$f_2(t) = \frac{\left[\sigma_{RJ,RMS}(2t-DJ_{P-P})\exp\left(-\left(\frac{2t-DJ_{P-P}}{2\sqrt{2}\,\sigma_{RJ,RMS}}\right)^2\right)\right]}{\sqrt{2\pi}\,DJ_{P-P}^2(1-\alpha^2)} + \frac{\left[\begin{array}{c}(4\sigma_{RJ,RMS}^2+(2t-DJ_{P-P})^2)\cdot\\ \mathrm{erf}\left(\frac{2t-DJ_{P-P}}{2\sqrt{2}\,\sigma_{RJ,RMS}}\right)\end{array}\right]}{4DJ_{P-P}^2(1-\alpha^2)}$$

$$f_3(t) = \frac{\left[\sigma_{RJ,RMS}(2t+\alpha DJ_{P-P})\exp\left(-\left(\frac{2t+\alpha DJ_{P-P}}{2\sqrt{2}\,\sigma_{RJ,RMS}}\right)^2\right)\right]}{\sqrt{2\pi}\,DJ_{P-P}^2(1-\alpha^2)} + \frac{\left[\begin{array}{c}(4\sigma_{RJ,RMS}^2+(2t+\alpha DJ_{P-P})^2)\cdot\\ \mathrm{erf}\left(\frac{2t+\alpha DJ_{P-P}}{2\sqrt{2}\,\sigma_{RJ,RMS}}\right)\end{array}\right]}{4DJ_{P-P}^2(1-\alpha^2)}$$

$$f_4(t) = \frac{\left[\sigma_{RJ,RMS}(2t-\alpha DJ_{P-P})\exp\left(-\left(\frac{2t-\alpha DJ_{P-P}}{2\sqrt{2}\,\sigma_{RJ,RMS}}\right)^2\right)\right]}{\sqrt{2\pi}\,DJ_{P-P}^2(1-\alpha^2)} + \frac{\left[\begin{array}{c}(4\sigma_{RJ,RMS}^2+(2t-\alpha DJ_{P-P})^2)\cdot\\ \mathrm{erf}\left(\frac{2t-\alpha DJ_{P-P}}{2\sqrt{2}\,\sigma_{RJ,RMS}}\right)\end{array}\right]}{4DJ_{P-P}^2(1-\alpha^2)}$$

Expression 13 expresses the relation between the sampling timing and the bit error rate in a transmission model for transmitting the signal having jitter that includes the random component and the deterministic component having the trapezoidal distribution with a trapezoid ratio α. Accordingly, when the type of probability density distribution of the deterministic component in the jitter of the target signal is a trapezoidal distribution, the calculating section 18 may use the relational expression shown by Expression 13 to calculate the range of sampling timings over which the bit error rate is less than or equal to a designated value or the bit error rate at a designated sampling timing.

More specifically, when the type of probability density distribution of the deterministic component in the jitter of the target signal is a trapezoidal distribution and a sampling timing is designated, the calculating section 18 may calculate the bit error rate by substituting the standard deviation of the random component, the peak-to-peak value of the deterministic component, the trapezoid ratio, and the sampling timing into Expression 13. When the type of probability density distribution of the deterministic component in the jitter of the target signal is a trapezoidal distribution and a bit error rate is designated, the calculating section 18 may calculate the maximum value of the jitter at which the bit error rate is less than or equal to a designated value by substituting the standard deviation of the random component, the peak-to-peak value of the deterministic component, the trapezoid ratio, and the bit error rate into an expression approximating the inverse of Expression 13.

The calculating section 18 may then calculate the range of sampling timings over which the bit error rate is less than or equal to a designated value by subtracting double the calculated maximum jitter value, i.e. the peak-to-peak value of the jitter, from an average value of the bit intervals of the target signal. In this way, when the type of probability density distribution of the deterministic component in the jitter of the target signal is a trapezoidal distribution with a trapezoid ratio α, the calculating apparatus 10 can accurately calculate the range of amplitude values over which the bit error rate is less than or equal to a designated value or the bit error rate at a designated amplitude value.

When calculating the range of amplitude values over which the bit rate error is less than or equal to a designated value, i.e. the eye aperture in the amplitude direction, or the bit error rate at a designated amplitude value, the calculating apparatus 10 may use each of the above Expressions 11 to 13, but with the variable t representing a sampling timing replaced with a variable g representing an amplitude value. In this way, when the type of probability density distribution of the deterministic component in the jitter of the target signal is a dual Dirac distribution, a uniform distribution, or a trapezoidal distribution with a trapezoid ratio α, the calculating apparatus 10 can accurately calculate the range of amplitude values over which the bit error rate is less than or equal to a designated value or the bit error rate at a designated amplitude value.

Figure 12:
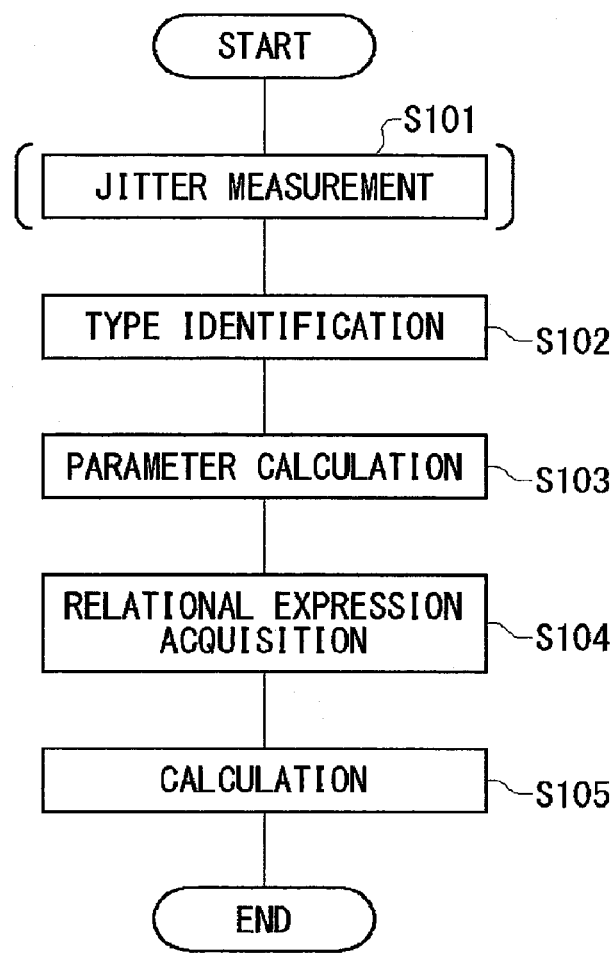
FIG. 12 is a flow chart showing the basics of the processes performed by the calculating apparatus 10 to calculate the range of sampling timings over which the bit error rate is less than or equal to a designated value or the bit error rate at a designated sampling timing.

FIG. 12 is a flow chart showing the basics of the processes performed by the calculating apparatus 10 to calculate the range of sampling timings over which the bit error rate is less than or equal to a designated value or the bit error rate at a designated sampling timing. First, the calculating apparatus 10 measures, a plurality of times, the jitter of the target signal to be transmitted through an electric circuit, an optical circuit, or the like to generate a probability density function expressing the jitter distribution of the target signal (S101). If the probability density function is supplied from another apparatus, the calculating apparatus 10 need not perform this step.

Next, the calculating apparatus 10 identifies the type of probability density distribution of the deterministic component in the jitter of the target signal, based on the probability density function of the jitter of the target signal (S102). The calculating apparatus 10 then calculates the standard deviation of the random component in the jitter of the target signal and the peak-to-peak value of the deterministic component in the jitter of the target signal, based on the probability density function of the jitter of the target signal (S103). If the type of probability density distribution of the deterministic component in the jitter is a trapezoidal distribution, the calculating apparatus 10 may further calculate the trapezoid ratio.

Next, the calculating apparatus 10 substitutes the parameters into the relational expression corresponding to the type of probability density distribution of the deterministic component in the jitter of the target signal to obtain the relational expression between the sampling timing and the bit error rate (S104). More specifically, the parameters substituted into the relational expression by the calculating apparatus 10 are the standard deviation of the random component, the peak-to-peak value of the deterministic component, and the trapezoid ratio.

Next, the calculating apparatus 10 substitutes the value designated in the obtained relational expression, e.g. the bit error rate or the sampling timing, to calculate the range of sampling timings over which the bit error rate is less than or equal to the designated value or the bit error rate at the designated sampling timing (S105). In this way, the calculating apparatus 10 can accurately calculate the range of sampling timings over which the bit error rate is less than or equal to a designated value or the bit error rate at a designated sampling timing.

Figure 13:
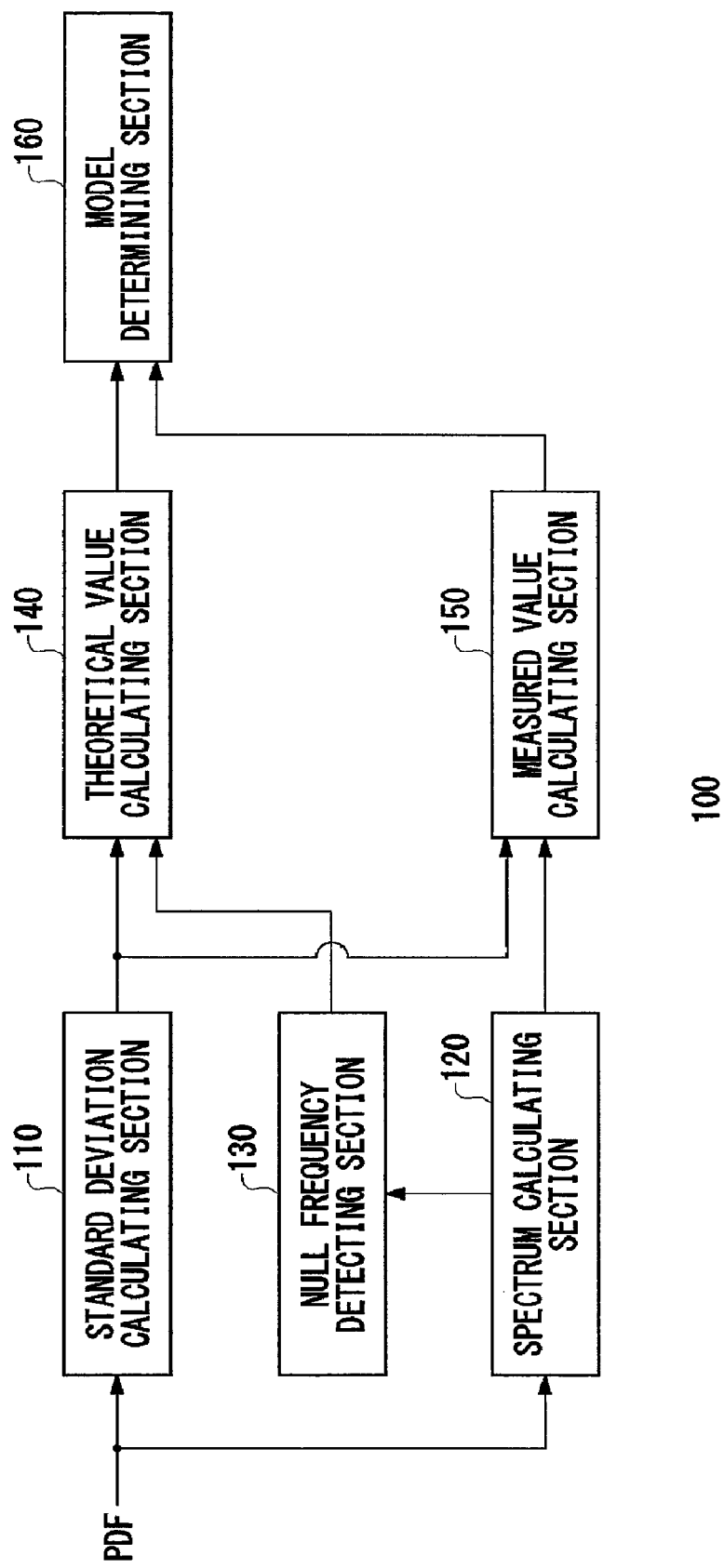
FIG. 13 shows an exemplary functional configuration of a deterministic component identifying apparatus 100 according to an embodiment of the present invention.

FIG. 13 shows an exemplary functional configuration of a deterministic component identifying apparatus 100 according to an embodiment of the present invention. The deterministic component identifying apparatus 100 determines the distribution shape of a deterministic component included in a probability density function supplied thereto. In particular, the deterministic component identifying apparatus 100 determines the type or model of the deterministic component. The deterministic component identifying apparatus 100 includes a standard deviation calculating section 110, a spectrum calculating section 120, a null frequency detecting section 130, a theoretical value calculating section 140, a measured value calculating section 150, and a model determining section 160.

First, a probability density function, a deterministic component, and a random component will be described. If the deterministic component and the random component, which are included in the probability density function, are independent from each other, the probability density function on the time axis can be calculated as a convolution of the deterministic component and the random component on the time axis. Therefore, the spectrum H(f) of the probability density function can be calculated as a product of the deterministic component spectrum D(f) and the random component spectrum R(f), as shown below.

$$H(f) = D(f) \cdot R(f)$$

The random component usually follows a Gaussian distribution, and therefore the spectrum R(f) can be found using the expression below.

$$R(f) = \exp(-2\pi^2 \sigma^2_{RJ,RMS} f^2)$$

Here, $\sigma_{RJ,RMS}$ represents the standard deviation of the random component. Therefore, the random component can be determined if the standard deviation of the random component can be measured. The deterministic component can then be determined by subtracting the random component from the provided probability density function.

The provided probability density function, however, includes the deterministic component and the random component, and therefore it is difficult to measure the standard deviation of only the random component from the probability density function. But if the deterministic component and the random component are independent from each other, the standard deviation $\sigma_{RJ,RMS}$ of the probability density function can be calculated from the standard deviation $\sigma_{RJ,RMS}$ of the random component and the standard deviation $DJ_{RMS}$ of the deterministic component, as shown by the expression below.

$$\sigma_{TJ,RMS}^2 = \sigma^2_{RJ,RMS} + DJ_{RMS}^2$$

Accordingly, the spectrum of the probability density function can be calculated by Expression 1 below $$H(f) = D(f) \cdot \exp(-2\pi^2 \sigma^2_{TJ,RMS} f^2) \cdot \exp(-2\pi^2 DJ^2_{RMS} f^2) \quad \text{Expression 1:}$$

The standard deviation $DJ_{RMS}$ of the deterministic component can be calculated from the peak-to-peak value $DJ_{P-P}$ of the deterministic component. In other words, Expression 1 can be used to separate the deterministic component D(f) from the probability density function H(f) if the standard deviation $\sigma_{TJ,RMS}$ of the probability density function and the peak-to-peak value $DJ_{P-P}$ of the deterministic component can be measured.

The standard deviation calculating section 110 calculates the standard deviation $\sigma_{RJ,RMS}$ of the provided probability density function. The standard deviation calculating section 110 may calculate the standard deviation $\sigma_{TJ,RMS}$ of the probability density function on the time axis using Expression 2.

$$\sigma_{TJ,RMS} = \sqrt{\sum_{k=1}^{N} p_k (x_k - \mu)^2} \quad \text{Expression 2}$$

Here, $x_i$ is the central value of the i-th bin of the provided probability density function, $y_i$ is the number of events of the i-th bin, and N is the total number of bins. Furthermore, $p_i$ and $\mu$ are provided below.

$$p_i = \frac{y_i}{\sum_{k=1}^{N} y_k}, \mu = \sum_{k=1}^{N} p_k x_k$$

The spectrum calculating section 120 outputs a spectrum of the provided probability density function. The standard deviation calculating section 110 and the spectrum calculating section 120 may be provided, in parallel, with the probability density function on the time axis.

The null frequency detecting section 130 detects a null frequency of the spectrum calculated by the spectrum calculating section 120. The null frequency is a frequency at which the power of the spectrum is substantially zero or a very small value. As described above, the peak-to-peak value $DJ_{P-P}$ of the deterministic component can be calculated from the null frequency of the spectrum of the probability density function.

Figure 14A:
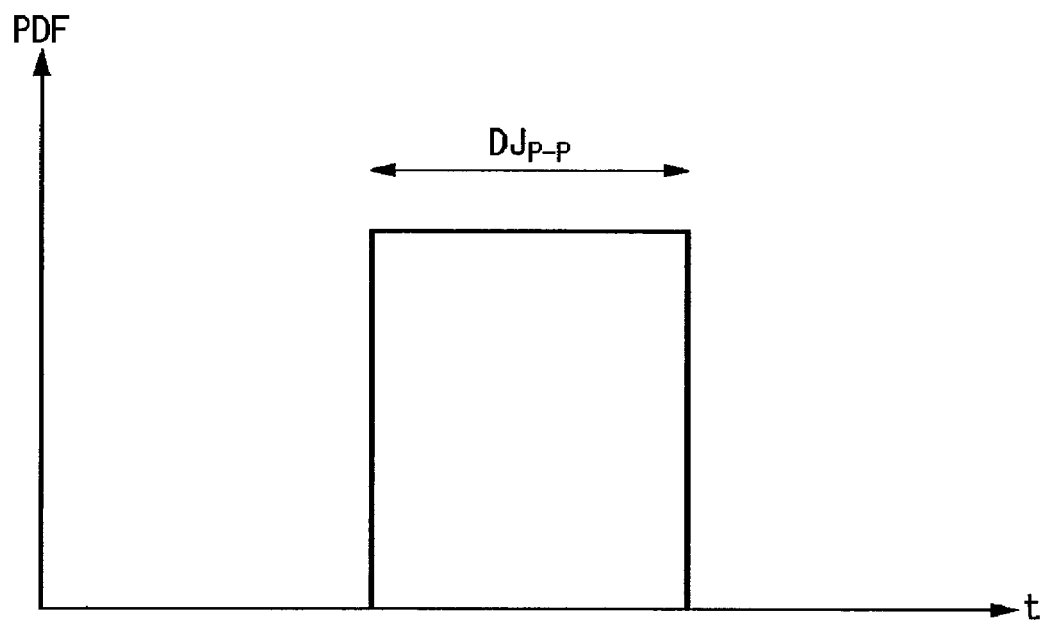
FIG. 14A shows a probability density function of a deterministic component having a uniform distribution.
Figure 14B:
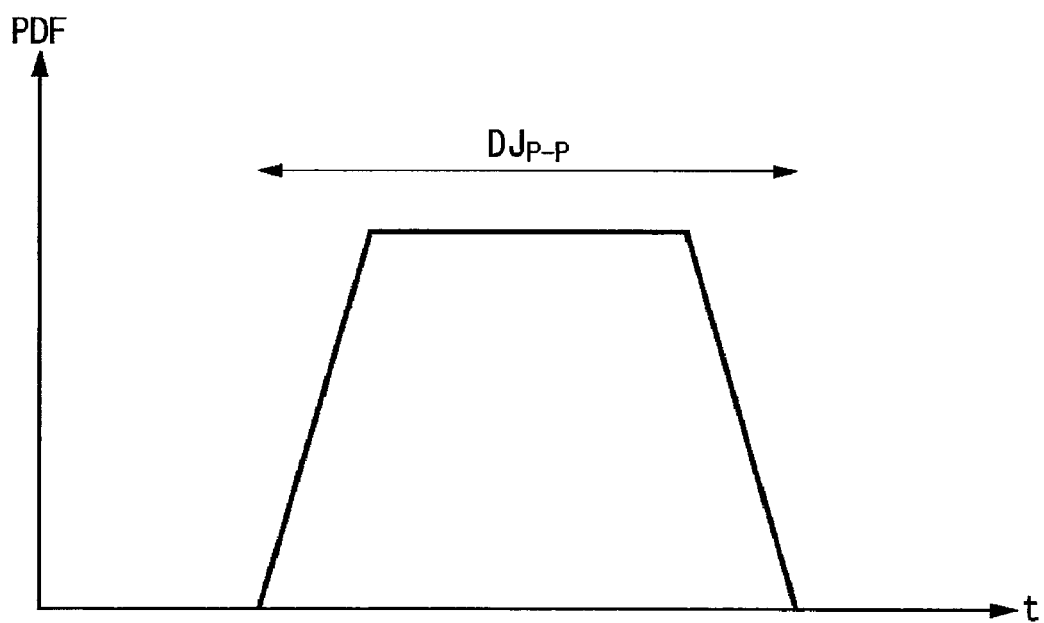
FIG. 14B shows a probability density function of a deterministic component having a trapezoidal distribution.
Figure 15A:
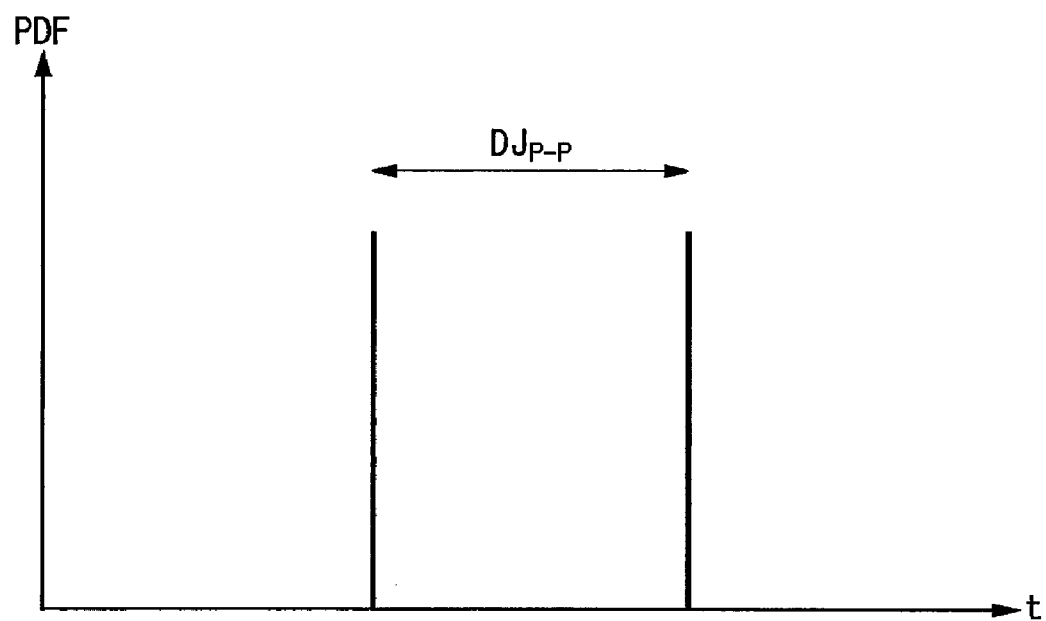
FIG. 15A shows a probability density function of a deterministic component having a dual Dirac distribution.
Figure 15B:
FIG. 15B shows a probability density function of a deterministic component having a single Dirac distribution.

FIGS. 14A, 14B, 15A, and 15B show probability density function having deterministic components having various models. FIG. 14A shows a deterministic component having a uniform distribution. FIG. 14B shows a deterministic component having a trapezoidal distribution. FIG. 15A shows a deterministic component having a dual Dirac distribution. FIG. 15B shows a deterministic component having a single Dirac distribution.

As shown in FIGS. 14A to 15B, the distribution of the deterministic component can usually be determined for a certainty if the peak-to-peak value $DJ_{P-P}$ is determined in the corresponding model. However, it is desirable that a ratio between a top portion and a bottom portion be further provided for the deterministic component having the trapezoidal distribution. Furthermore, the deterministic component having the single Dirac distribution is provided as a deterministic component with a peak-to-peak value of substantially zero.

The deterministic component identifying apparatus 100 of the present embodiment calculates the peak-to-peak value $DJ_{P-P}$ of the deterministic component based on the null frequency of the spectrum of the probability density function. The following describes an example in which the smallest frequency among the null frequencies of the spectrum is used as a first null frequency.

FIGS. 16A and 16B show the probability density function and the spectrum of deterministic components having prescribed models. FIG. 16A shows the probability density function and the spectrum of a deterministic component having a sinusoidal distribution model. FIG. 16B shows the probability density function and the spectrum of a deterministic component having a uniform distribution model. In FIGS. 16A and 16B, the waveform on the left represents the probability density function in the time domain, and the waveform on the right represents the spectrum of the probability density function. Furthermore, $DJ_{P-P}$ represents the peak-to-peak value of the deterministic component in the time domain.

As shown in FIG. 16A, the first null frequency of the spectrum obtained by performing a Fourier transform on the probability density function of the deterministic component having the sinusoidal distribution is calculated as $0.765/DJ_{P-P}$. In other words, the peak-to-peak value $DJ_{P-P}$ of the deterministic component can be calculated by multiplying the inverse of the first null frequency by the coefficient 0.765. It should be noted that this coefficient is an approximate value, and more or less accurate values may be used instead, such as coefficients accurate to more or fewer decimals.

As shown in FIG. 16B, the first null frequency of the spectrum obtained by performing a Fourier transform on the probability density function of the deterministic component having the uniform distribution is calculated as $1/DJ_{P-P}$. In other words, the peak-to-peak value $DJ_{P-P}$ of the deterministic component can be calculated as the inverse of the first null frequency.

The peak-to-peak values of the deterministic components having other distributions, e.g. the trapezoidal distribution and the single Dirac distribution, can be calculated from the first null frequency in the same way. However, it is necessary to determine the model in order to accurately calculate the deterministic component, since the relationship between the first null frequency and the peak-to-peak value $DJ_{P-P}$ is different depending on the deterministic component model, as shown in FIGS. 16A and 16B.

Figure 17:
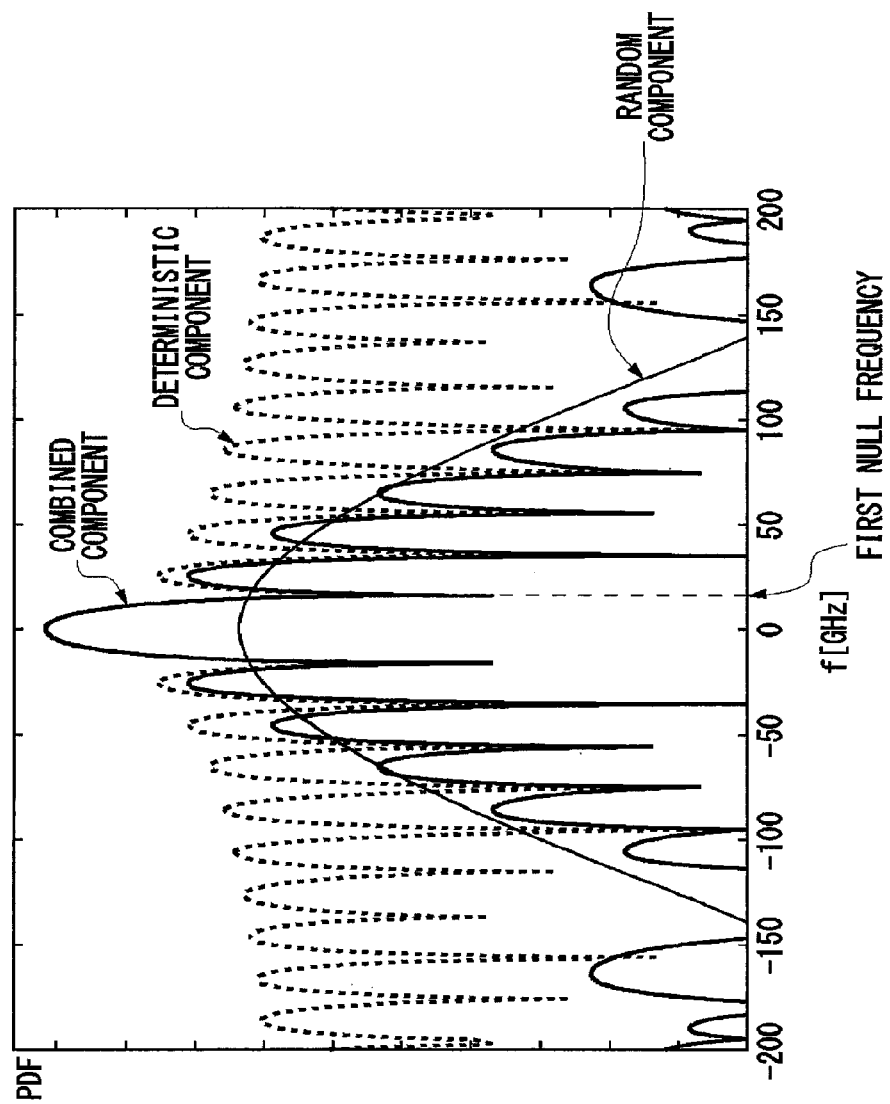
FIG. 17 shows an exemplary spectrum calculated by the spectrum calculating section 120.

FIG. 17 shows an exemplary spectrum calculated by the spectrum calculating section 120. The spectrum calculating section 120 calculates the spectrum of the provided probability density function. The spectrum calculating section 120 may calculate the spectrum by performing a Fourier transform on the provided probability density function. The spectrum calculated by the spectrum calculating section 120 includes a spectrum of the deterministic component and a spectrum of the random component, as shown in FIG. 17.

The null frequency detecting section 130 detects the null frequency of the spectrum calculated by the spectrum calculating section 120. The null frequency detecting section 130 of the present embodiment detects the first null frequency, which is the smallest frequency from among the null frequencies of the spectrum.

In the manner described above, the first null frequency of the spectrum of the deterministic component corresponds to the peak-to-peak value of the deterministic component on the time axis. As shown in FIG. 17, the first null frequency of the combined spectrum of the deterministic component and the random component is almost identical to the first null frequency of the spectrum of the deterministic component.

Therefore, the first null frequency of the spectrum of the deterministic component can be detected by detecting the first null frequency of the spectrum of the provided probability density function. As described above, the peak-to-peak value $DJ_{P-P}$ of the deterministic component can be calculated from the first null frequency of the spectrum of the deterministic component. It should be noted that the calculated peak-to-peak value $DJ_{P-P}$ is different for each type of deterministic component.

FIG. 18 is a chart showing a time domain model, a frequency domain model, a relation between the first null frequency $f_{zero}$ and the peak-to-peak value $DJ_{P-P}$, and the relationship between the peak-to-peak value $DJ_{P-P}$ and a root mean squared value $DJ_{RMS}$, for each type of deterministic component. In FIG. 18, $I_0$ represents a Bessel function of the first kind with an order of 0.

In FIG. 18, $\alpha$ represents the ratio of the top portion to the bottom portion in the trapezoidal distribution. In other words, $\alpha=1$ corresponds to a uniform distribution, and $\alpha=0$ corresponds to a triangular distribution. The types of deterministic components that can be handled by the deterministic component identifying apparatus 100 are not limited to the types described above. The deterministic component identifying apparatus 100 may determine models for any deterministic component whose peak-to-peak value can be calculated from the first null frequency of the spectrum.

Here, the model for each type of deterministic component spectrum is expressed by the first null frequency $f_{zero}$, and the standard deviation $\sigma_{TJ,RMS}$ that can be calculated from the provided probability density function. The model for the spectrum of a deterministic component having a sinusoidal distribution is obtained from Expression 1 and FIG. 18, and is shown below in Expression 3.

$$H_{sin}(f) = I_0\left(0.765\pi \cdot \frac{f}{f_{zero}}\right) \cdot$$
$$\exp\left(\frac{0.765^2\pi^2}{4} \cdot \frac{f^2}{f_{zero}^2}\right) \cdot \exp(-2\pi^2 f^2 \sigma_{TJ,RMS}^2)$$

Expression 3

The model for the spectrum of a deterministic component having a trapezoidal distribution is provided in Expression 4.

$$H_{Tra}(f, \alpha) = \mathrm{sinc}\left(\frac{f}{f_{zero}}\right) \cdot \mathrm{sinc}\left(\frac{1-\alpha}{1+\alpha} \cdot \frac{f}{f_{zero}}\right) \cdot$$
$$\exp\left(\frac{\pi^2(1+\alpha^2)}{3(1+\alpha)^2} \cdot \frac{f^2}{f_{zero}^2}\right) \cdot \exp(-2\pi^2 f^2 \sigma_{TJ,RMS}^2)$$

Expression 4

The model for the spectrum of a deterministic component having a dual Dirac distribution is provided in Expression 5.

$$H_{DD}(f) =$$
$$\cos\left(\frac{\pi}{2} \cdot \frac{f}{f_{zero}}\right) \cdot \exp\left(\frac{\pi^2}{8} \cdot \frac{f^2}{f_{zero}^2}\right) \cdot \exp(-2\pi^2 f^2 \sigma_{TJ,RMS}^2)$$

Expression 5

The model for the spectrum of a deterministic component having a single Dirac distribution is provided in Expression 6.

$$H_{Dirac}(f) = \exp(-2\pi^2 f^2 \sigma_{TJ,RMS}^2)$$

Expression 6:

The theoretical value calculating section 140 calculates theoretical values of the spectrum of each of a plurality of types of predetermined deterministic components, based on the standard deviation $\sigma_{TJ,RMS}$ calculated by the standard deviation calculating section 110 and the first null frequency $f_{zero}$ detected by the null frequency detecting section 130. For example, the theoretical value calculating section 140 calculates the theoretical values of each type of deterministic component based on Expressions 3 to 6. The theoretical value calculating section 140 may be provided in advance with Expressions 3 to 6.

The theoretical value calculating section 140 may instead calculate the theoretical values of the spectra normalized by a Gaussian distribution spectrum having the standard deviation $\sigma_{TJ,RMS}$ calculated by the standard deviation calculating section 110. For example, the theoretical value calculating section 140 may calculate Y(x) in Expressions 3 to 6 using Expression 7.

$$Y(x)=H(x)/\exp(-2\pi^2 f^2 \sigma_{TJ,RMS}^2)$$  Expression 7:

The theoretical value calculating section 140 may instead calculate the theoretical values of the spectra having a frequency f normalized with the first null frequency $f_{zero}$. For example, the theoretical value calculating section 140 may calculate the theoretical values in Expressions 3 to 6 with $x=f/f_{zero}$.

When such normalizations are performed, Expressions 3 to 6 transform into the Expressions below.

$$Y_{sin}(x) = I_0(0.765\pi \cdot x) \cdot \exp\left(\frac{0.765^2 \pi^2}{4} \cdot x^2\right)$$  Expression 3'

$$Y_{Tra}(x, \alpha) = \mathrm{sinc}(x) \cdot \mathrm{sinc}\left(\frac{1-\alpha}{1+\alpha} \cdot x^2\right) \cdot \exp\left(\frac{\pi^2(1+\alpha^2)}{3(1+\alpha)^2} \cdot x^2\right)$$  Expression 4'

$$Y_{DD}(x) = \cos\left(\frac{\pi}{2} \cdot x\right) \cdot \exp\left(\frac{\pi^2}{8} \cdot x^2\right)$$  Expression 5'

$$Y_{Dirac}(x) = 1$$  Expression 6'

The theoretical value calculating section 140 may be provided in advance with Expressions 3' to 6'. In this case, the theoretical value calculating section 140 may calculate the theoretical values of the spectra of the various typed of deterministic components by substituting the first null frequency detected by the null frequency detecting section 130 into Expressions 3' to 6'.

The measured value calculating section 150 calculates measured values of the deterministic component spectrum in the probability density function PDF, based on the standard deviation $\sigma_{TJ,RMS}$ calculated by the standard deviation calculating section 110 and the spectrum calculated by the spectrum calculating section 120. The measured value calculating section 150 may use the spectrum H(x) obtained by normalizing the frequency of the spectrum H(f) calculated by the spectrum calculating section 120 with the first null frequency $f_{zero}$.

Figure 19:
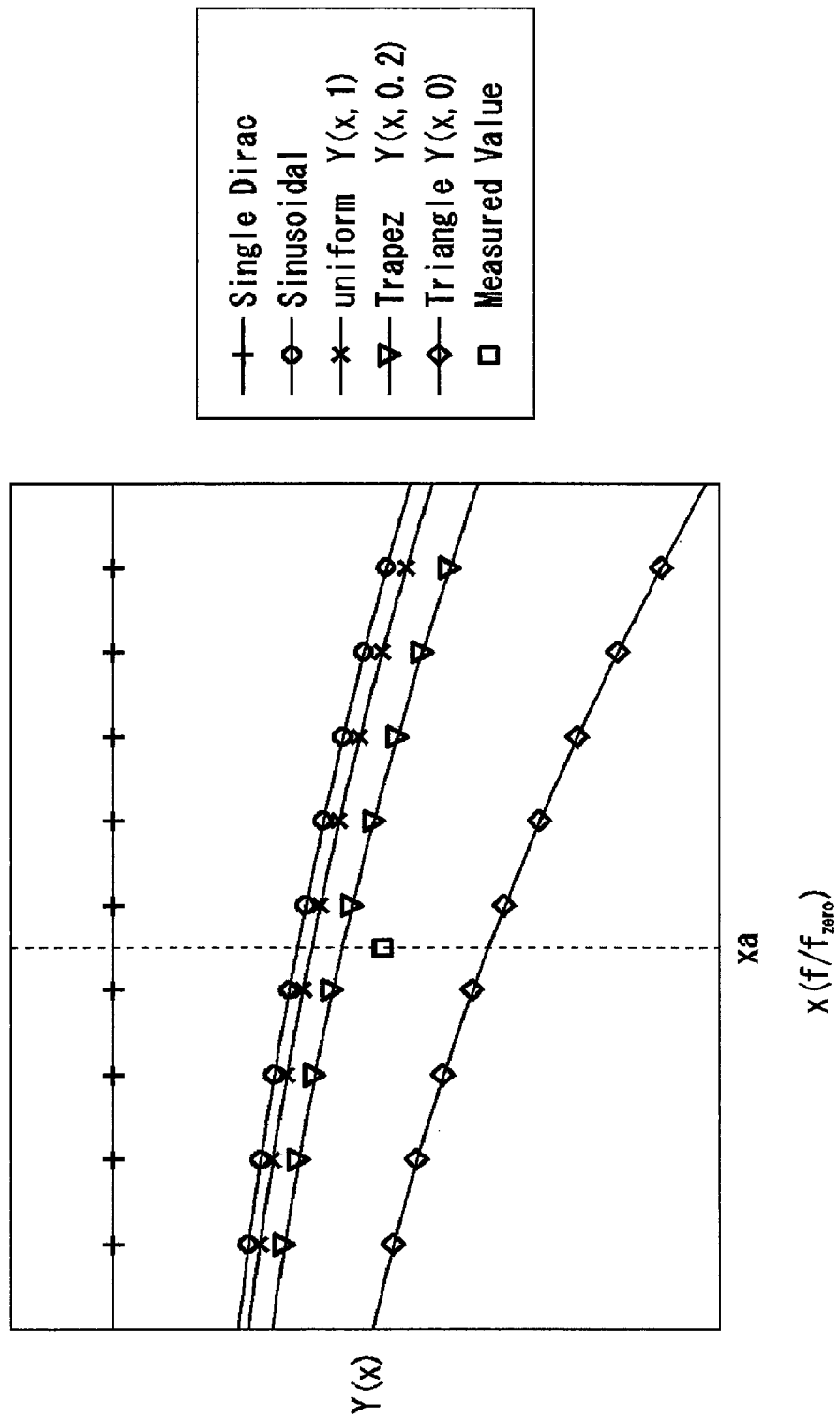
FIG. 19 shows examples of theoretical values of various types of deterministic component spectra Y(x) calculated by the theoretical value calculating section 140 and a measured value of the deterministic component spectra Y(x) calculated by the measured value calculating section 150.

The measured value calculating section 150 may calculate the measured values of the deterministic component spectrum by dividing the spectrum H(x) by a Gaussian distribution spectrum having the standard deviation $\sigma_{TJ,RMS}$. In this case, the measured values of the deterministic component spectrum Y(x), shown below, can be obtained from Expression 7.

$$Y(x)=H(x)/\exp(-2\pi^2 f_{zero}^2 x^2 \sigma_{TJ,RMS}^2)$$  Expression 8:

FIG. 19 shows examples of theoretical values of various types of deterministic component spectra Y(x) calculated by the theoretical value calculating section 140 and a measured value of the deterministic component spectra Y(x) calculated by the measured value calculating section 150. As shown in FIG. 19, the following relationship is seen within a range of 0<x<1.

$$Y_{Dirac}(x) > Y_{DD}(x) > Y_{sin}(x) > Y_{Tra}(x,\alpha)$$

The larger the value of α, which is the ratio of the top portion to the bottom portion the trapezoidal distribution, the larger the value of $Y_{Tra}(x,\alpha)$, as shown in the Expression below.

$$Y_{Tra}(x,1) > Y_{Tra}(x,0.5) > Y_{Tra}(x,0.2) > Y_{Tra}(x,0)$$

The model determining section 160 determines the type of deterministic component included in the probability density function to be the type corresponding to the theoretical values closest to the measured values calculated by the measured value calculating section 150, from among the theoretical values calculated by the theoretical value calculating section 140 for each type of deterministic component. The theoretical value calculating section 140 and the measured value calculating section 150 may calculate value of the spectrum at the same predetermined frequency, e.g. the frequency $f/f_{zero}$=xa in FIG. 19, as the theoretical value and the measured value.

In other words, the theoretical value calculating section 140 and the measured value calculating section 150 need not calculate the theoretical values and the measured values of the spectrum across all of the regions. It is, however, desirable that the theoretical value calculating section 140 and the measured value calculating section 150 calculate the value of the spectrum within a frequency range between 0 and the first null frequency. In other words, it is desirable that the theoretical value calculating section 140 and the measured value calculating section 150 calculate the value of the spectrum in a range of 0<xa<1.

In the example of FIG. 19, the measured value is nearest the theoretical value of the trapezoidal distribution (α=0.2), and therefore the model determining section 160 may determine that the type of deterministic component included in the probability density function is a trapezoidal distribution. If the model determining section 160 determines that the measured value calculated by the measured value calculating section 150 is between the theoretical value of the uniform distribution and the theoretical value of the triangular distribution, a new trapezoid ratio α may be calculated to bring the theoretical value closer to the measured value. The model determining section 160 may determine the deterministic component model to be the trapezoidal distribution having the calculated trapezoid ratio α.

As a result of the above process, the model determining section 160 can accurately determine the model of the deterministic component included in the probability density function. Therefore, the random component and the deterministic component in the probability density function can be accurately calculated.

Figure 20:
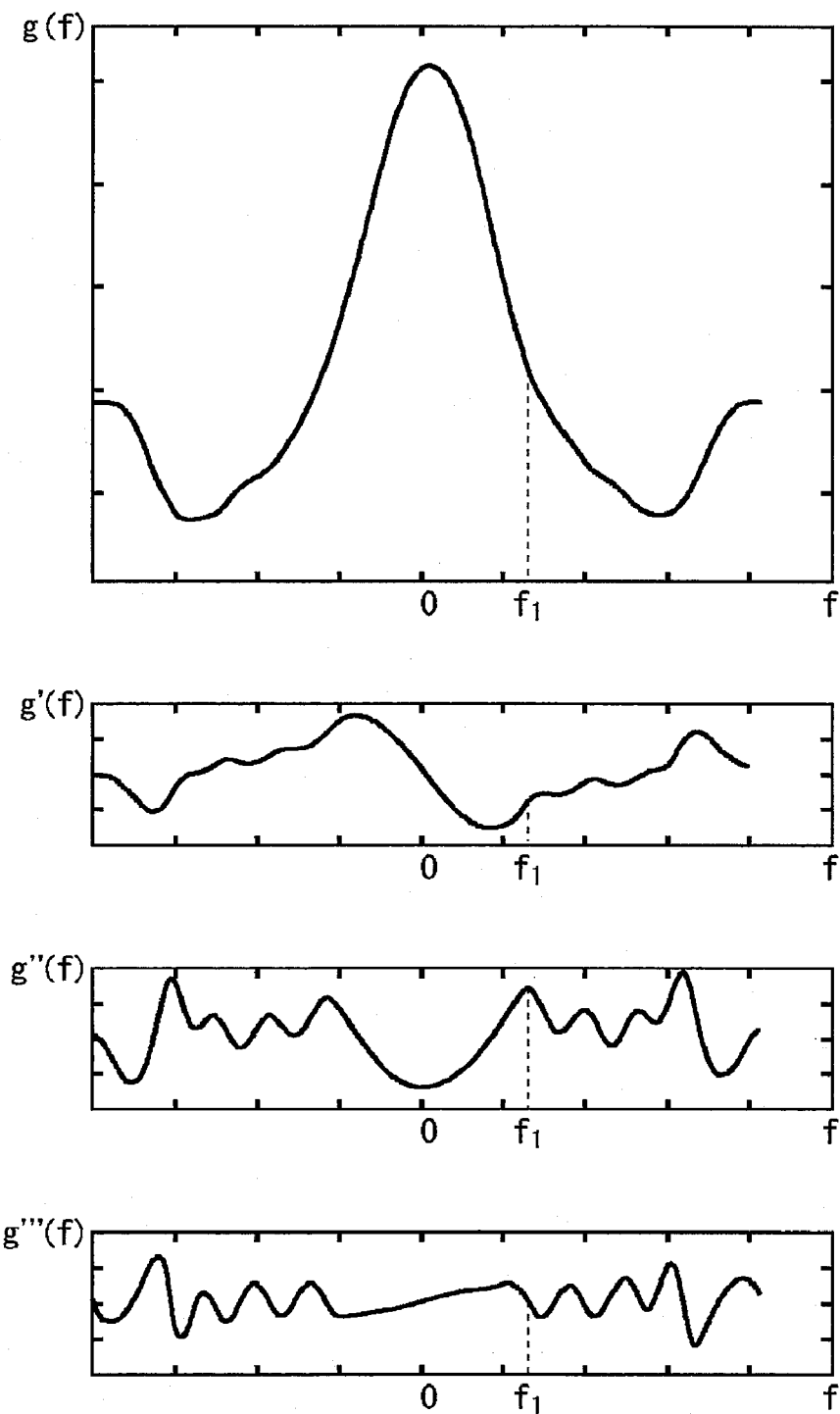
FIG. 20 shows an exemplary operation of the null frequency detecting section 130.

FIG. 20 shows an exemplary operation of the null frequency detecting section 130. The null frequency detecting section 130 of the present embodiment detects the first null frequency of the spectrum based on the peak of a waveform obtained by performing a second-order differentiation with respect to frequency on the spectrum calculated by the spectrum calculating section 120.

In the present embodiment, f1 represents the first null frequency of the spectrum. If the provided probability density function includes a small amount of noise, the first null frequency of the spectrum can be accurately detected. If, however, the provided probability density function includes a substantial amount of noise, as shown by the spectrum g(f) in FIG. 20, the first null frequency cannot be detected at the frequency f1 as intended.

In this case, the first null frequency can be accurately detected by differentiating the spectrum with respect to frequency, as shown in FIG. 20. The peak of the second-order differentiated waveform g"(f) of the spectrum corresponds to the null frequency of the spectrum g(f). Therefore, the null frequency detecting section 130 may perform a second-order derivation on the spectrum of the probability density function and detect the first null frequency based on the peak frequency of the derivative spectrum.

Figure 21:
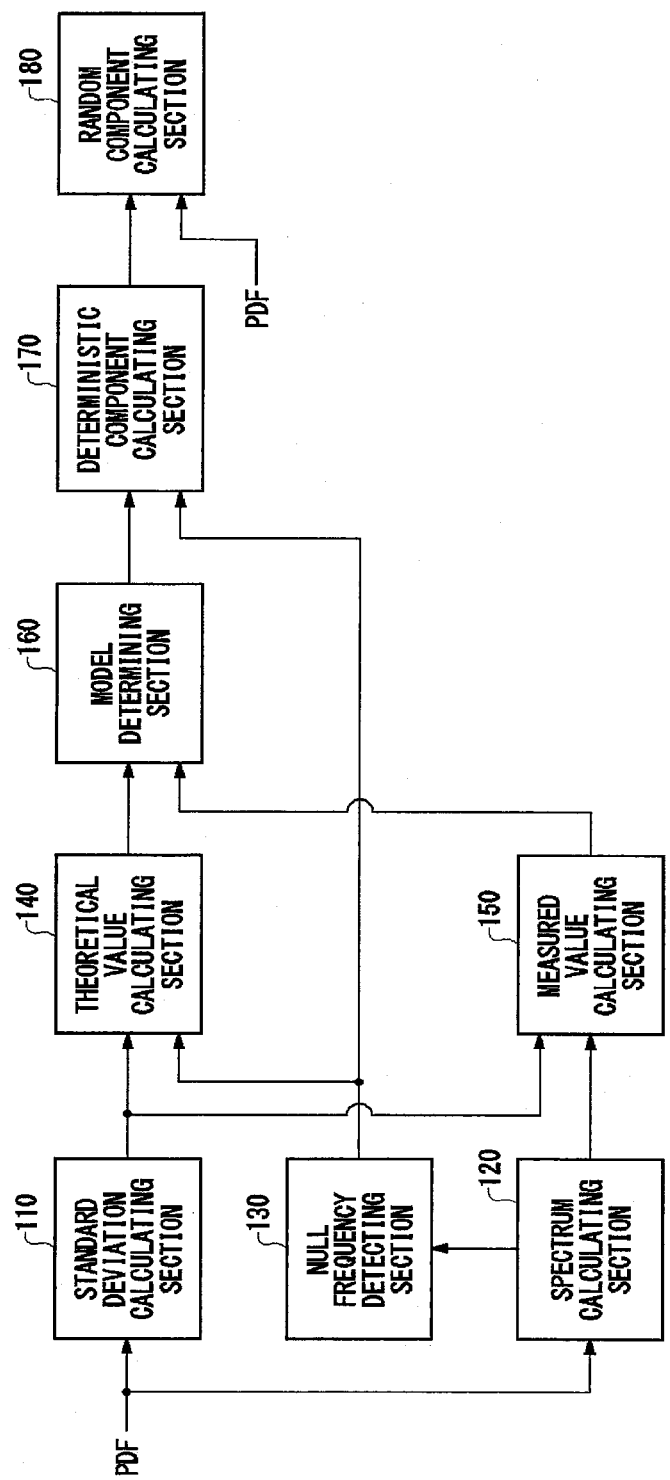
FIG. 21 shows another exemplary configuration of the deterministic component identifying apparatus 100.

FIG. 21 shows another exemplary configuration of the deterministic component identifying apparatus 100. The deterministic component identifying apparatus 100 of the present embodiment is further provided with a deterministic component calculating section 170 and a random component calculating section 180 in addition to the configuration of the deterministic component identifying apparatus 100 described in relation to FIG. 13. Other elements may be the same as the elements described in relation to FIG. 13.

The deterministic component calculating section 170 calculates the deterministic component included in the probability density function based on the type of the deterministic component determined by the model determining section 160 and the first null frequency detected by the null frequency detecting section 130. As shown in FIG. 18, the probability density function of the deterministic component in the frequency domain or the time domain can be determined from the type of the deterministic component and the peak-to-peak value $DJ_{P-P}$.

The deterministic component calculating section 170 may calculate the probability density function of the deterministic component by calculating the peak-to-peak value $DJ_{P-P}$ from the first null frequency. The deterministic component calculating section 170 may be provided with a table showing, for each type of deterministic component, a time-domain model, a frequency-domain model, a relation between the first null frequency $f_{zero}$, and the peak-to-peak value $DJ_{P-P}$, and the relationship between the peak-to-peak value $DJ_{P-P}$ and a root mean squared value $DJ_{RMS}$, as shown in FIG. 18.

The random component calculating section 180 calculates the random component included in the probability density function PDF by eliminating the deterministic component calculated by the deterministic component calculating section 170 from the probability density function PDF provided to the deterministic component identifying apparatus 100. For example, the random component calculating section 180 may calculate the random component in the time domain by deconvoluting the deterministic component in the time domain from the probability density function PDF in the time domain. The random component calculating section 180 may calculate the random component in the frequency domain by eliminating the deterministic component in the time domain from the probability density function PDF in the time domain. The random component calculating section 180 may further calculate the standard deviation of the calculated random component.

Using the configuration above enables the random component and the deterministic component in the probability density function to be accurately separated from each other. Therefore, when measuring jitter, for example, the target can be accurately evaluated because the random jitter and the deterministic jitter are accurately separated from each other.

Figure 22:
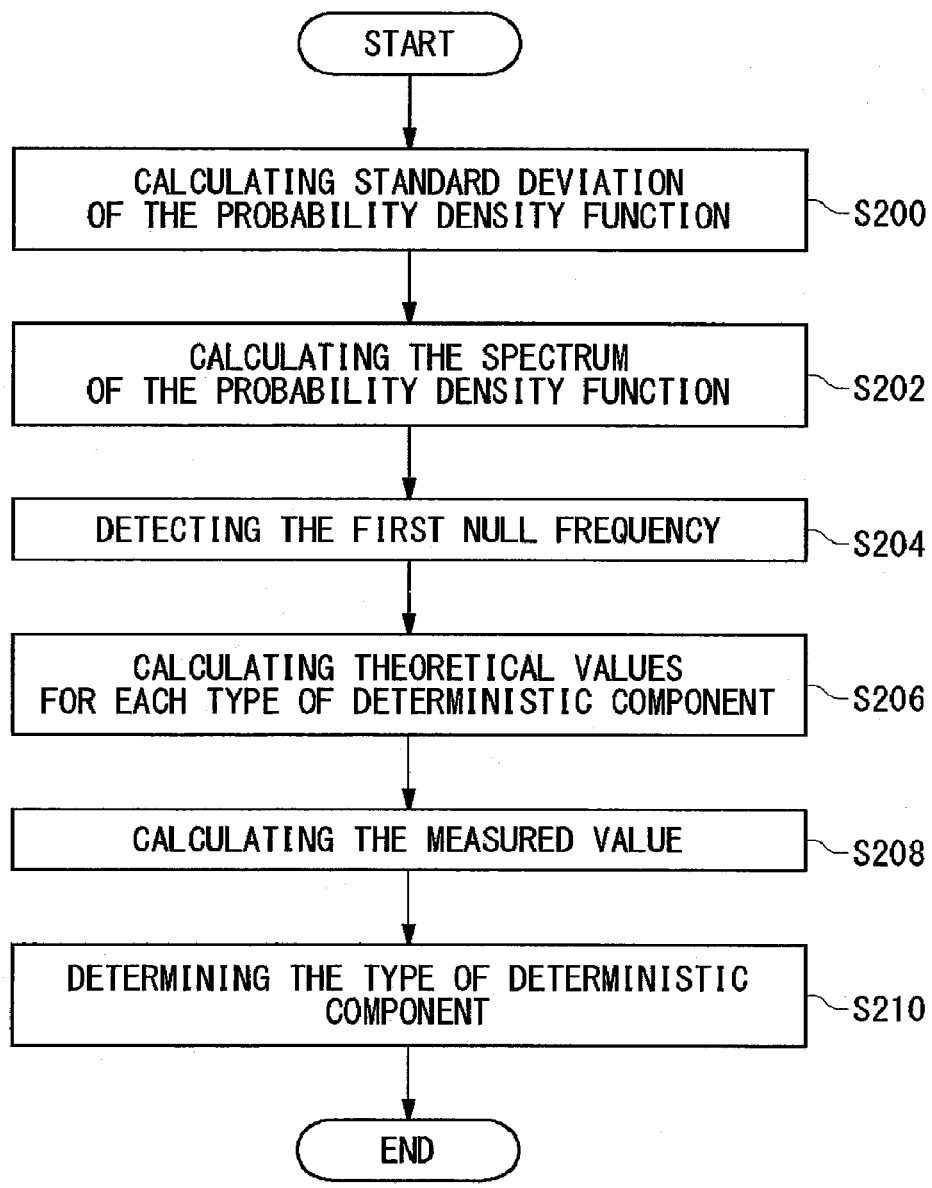
FIG. 22 is a flow chart showing the operation performed by the deterministic component identifying apparatus 100.

FIG. 22 is a flow chart showing the processes performed by the deterministic component identifying apparatus 100 for determining the model of the deterministic component. First, the standard deviation calculating section 110 calculates the standard deviation of the probability density function (S200). The spectrum calculating section 120 then calculates the spectrum of the probability density function (S202). Next, the null frequency detecting section 130 calculates the first null frequency of the spectrum calculated by the spectrum calculating section 120 (S204). The processes of S202 and S204 may be performed in parallel with the process of S200.

The theoretical value calculating section 140 calculates the theoretical values of each type of deterministic component based on the first null frequency detected by the null frequency detecting section 130 (S206). The measured value calculating section 150 then calculates the measured value of the deterministic component based on the standard deviation calculated by the standard deviation calculating section 110 and the spectrum calculated by the spectrum calculating section 120 (S208). The process of S208 may be performed in parallel with the process of S206.

The model determining section 160 compares each theoretical value calculated by the theoretical value calculating section 140 to the measured value calculated by the measured value calculating section 150 to determine the type of deterministic component included in the probability density function (S210). The processes described above enable the deterministic component identifying apparatus 100 to accurately determine the type of deterministic component.

Figure 23:
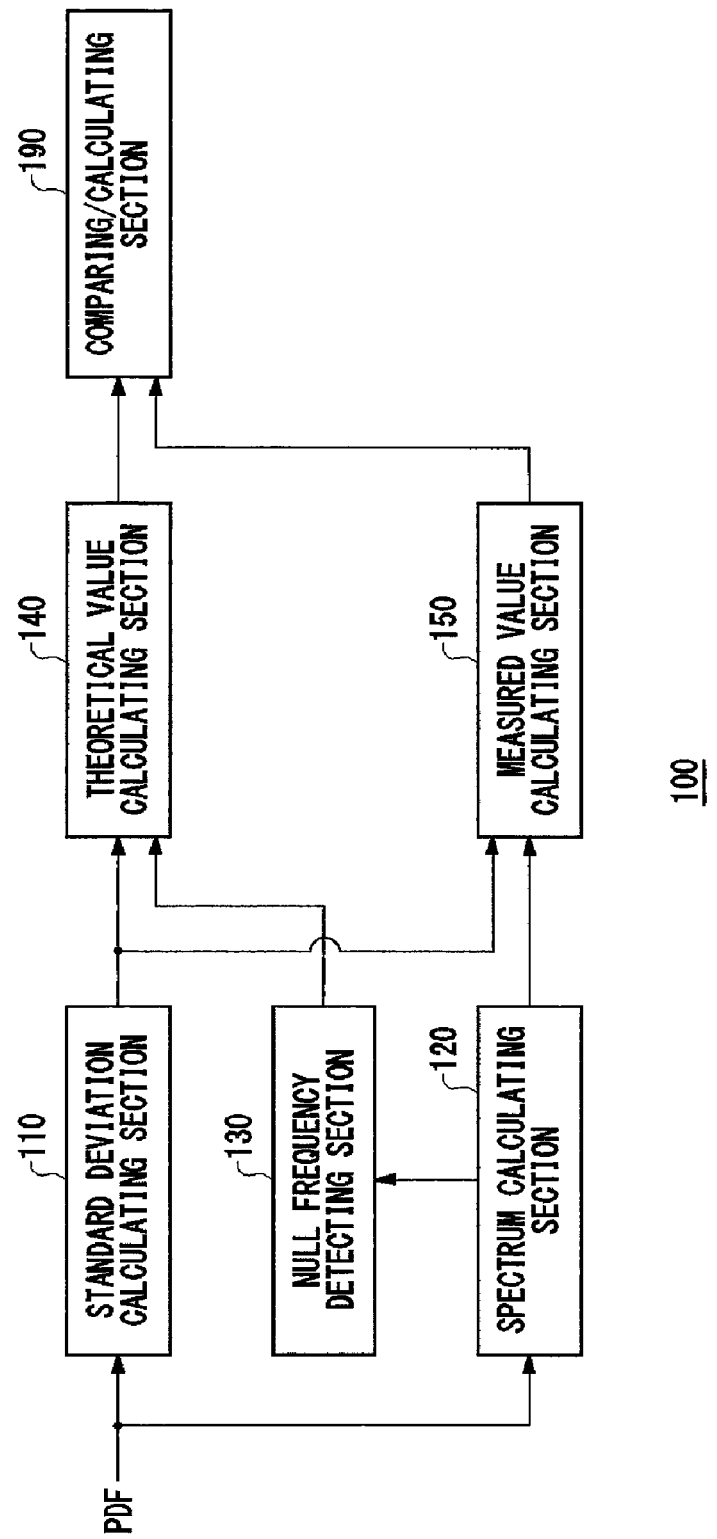
FIG. 23 shows another exemplary configuration of the deterministic component identifying apparatus 100.

FIG. 23 shows another exemplary configuration of the deterministic component identifying apparatus 100. The deterministic component identifying apparatus 100 of the present embodiment calculates the trapezoid ratio α of a deterministic component having a trapezoidal distribution. The deterministic component identifying apparatus 100 of the present embodiment has the same configuration as the deterministic component identifying apparatus 100 described in relation to FIG. 13, except that the model determining section 160 is replaced by a ratio calculating section 190. The standard deviation calculating section 110, the spectrum calculating section 120, the null frequency detecting section 130, the theoretical value calculating section 140, and the measured value calculating section 150 may have the same function and configuration as the elements having the same reference numerals in FIGS. 13 to 22.

The ratio calculating section 190 calculates the trapezoid ratio α based on the standard deviation of the probability density function calculated by the standard deviation calculating section 110, the spectrum of the probability density function calculated by the spectrum calculating section 120, and the null frequency detected by the null frequency detecting section 130. As shown in Expressions 4 and 4', the spectrum of the probability density function obtained when the deterministic component included in the probability density function follows a trapezoidal distribution is determined according to the first null frequency $f_{zero}$, the standard deviation $\sigma_{TJ,RMS}$ of the probability density function, and the trapezoid ratio α. Therefore, the trapezoid ratio can be calculated from the spectrum of the probability density function, the first null frequency $f_{zero}$, and the standard deviation $\sigma_{TJ,RMS}$ of the probability density function.

The measured value calculating section 150 calculates the measured value of the spectrum for the deterministic component included in the probability density function based on the standard deviation $\sigma_{TJ,RMS}$ calculated by the standard deviation calculating section 110 and the spectrum H(x) calculated by the spectrum calculating section 120. For example, the measured value calculating section 150 calculates the measured value of the spectrum using Expression 8. The measured value calculating section 150 may instead calculate the measured value Y(x1) of the spectrum at a preset frequency x1, where $x1 = f1/f_{zero}$.

The ratio calculating section 190 calculates the trapezoid ratio α such that the theoretical value of the spectrum of the deterministic component determined by the trapezoid ratio α and the first null frequency $f_{zero}$ is near the measured value of the spectrum. For example, the ratio calculating section 190 is provided with the theoretical values of the deterministic component spectra corresponding to several different preset trapezoid ratios α, and selects the trapezoid ratio α that corresponds to the theoretical value closest to the measured value calculated by the measured value calculating section 150.

The theoretical value calculating section 140 may calculate the theoretical value of each deterministic component spectrum corresponding to the several trapezoid ratios α. At this time, the theoretical value calculating section 140 may calculate the theoretical value at the preset frequency x1. The theoretical value calculating section 140 may calculate the theoretical value for each trapezoid ratio α using Expression 4'.

The theoretical value calculating section 140 notifies the ratio calculating section 190 about the theoretical values corresponding to the several trapezoid ratios α. As described above, the ratio calculating section 190 may compare these theoretical values to the measured value calculated by the measured value calculating section 150 and select the trapezoid ratio α that corresponds to the theoretical value closest to the measured value. The ratio calculating section 190 may calculate a trapezoid ratio that corresponds to a theoretical value substantially equal to the measured value by interpolating a theoretical value between the trapezoid ratios α used by the theoretical value calculating section 140. At this time, the ratio calculating section 190 may use widely known interpolation techniques such as linear interpolation or spline interpolation.

Another method for determining the trapezoid ratio α involves the ratio calculating section 190 generating an expression for obtaining the trapezoid ratio α, based on the plurality of theoretical values corresponding to the trapezoid ratios α supplied from the theoretical value calculating section 140, with the measured value H(x1) of the deterministic component spectrum at the prescribed frequency x1 as a variable. For example, the ratio calculating section 190 may receive a combination of N groups of trapezoid ratios α and theoretical values $H_{ideal}(x1)$ from the theoretical value calculating section 140.

The ratio calculating section 190 may then generate an expression that approximates α with an N−1 order polynomial of the theoretical values $H_{ideal}(xa)$. Here, when the theoretical value $H_{ideal}(x1)=m$, the N−1 order approximation expression can be obtained from Expression 9 below. Note that $k_i$ represents an i-th order coefficient.

$$\alpha = \sum_{i=0}^{N-1} k_i x^i \qquad \text{Expression 9}$$

The ratio calculating section 190 may calculate the trapezoid ratio α by substituting the measured value H(x) of the deterministic component spectrum calculated by the measured value calculating section 150 for x in Expression 9. This technique as well can be used to determine the trapezoid ratio α.

Yet another method for determining the trapezoid ratio α involves the ratio calculating section 190 using a sounding technique such as bisection to detect a trapezoid ratio α that causes the difference between (i) the theoretical value obtained when a prescribed trapezoid ratio α is substituted into Expression 4 and (ii) the measured value calculated by the measured value calculating section 150 to fall within a prescribed acceptable range. This technique as well can be used to determine the trapezoid ratio α.

Figure 24:
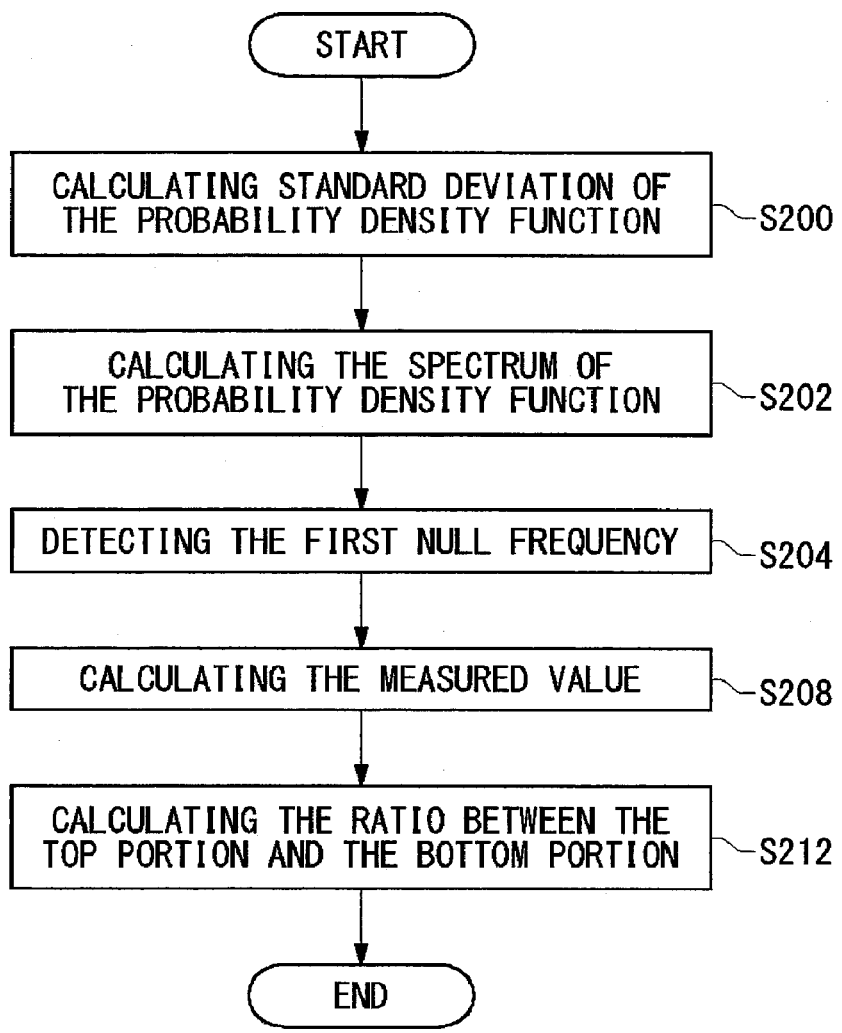
FIG. 24 is a flow chart showing an exemplary operation of the deterministic component identifying apparatus 100 described in relation to FIG. 23.

FIG. 24 is a flow chart showing an exemplary operation of the deterministic component identifying apparatus 100 described in relation to FIG. 23. In the present embodiment, the processes from S200 to S208 may be the same as the processes from S200 to S208 described in relation to FIG. 22. After the process of S208, the ratio calculating section 190 calculates the trapezoid ratio α, which is the ratio between the top portion and the bottom portion in the distribution of the deterministic component (S212). As a result of the processes described above, the trapezoid ratio of the deterministic component having a trapezoidal distribution included in the probability density function can be calculated.

Figure 25:
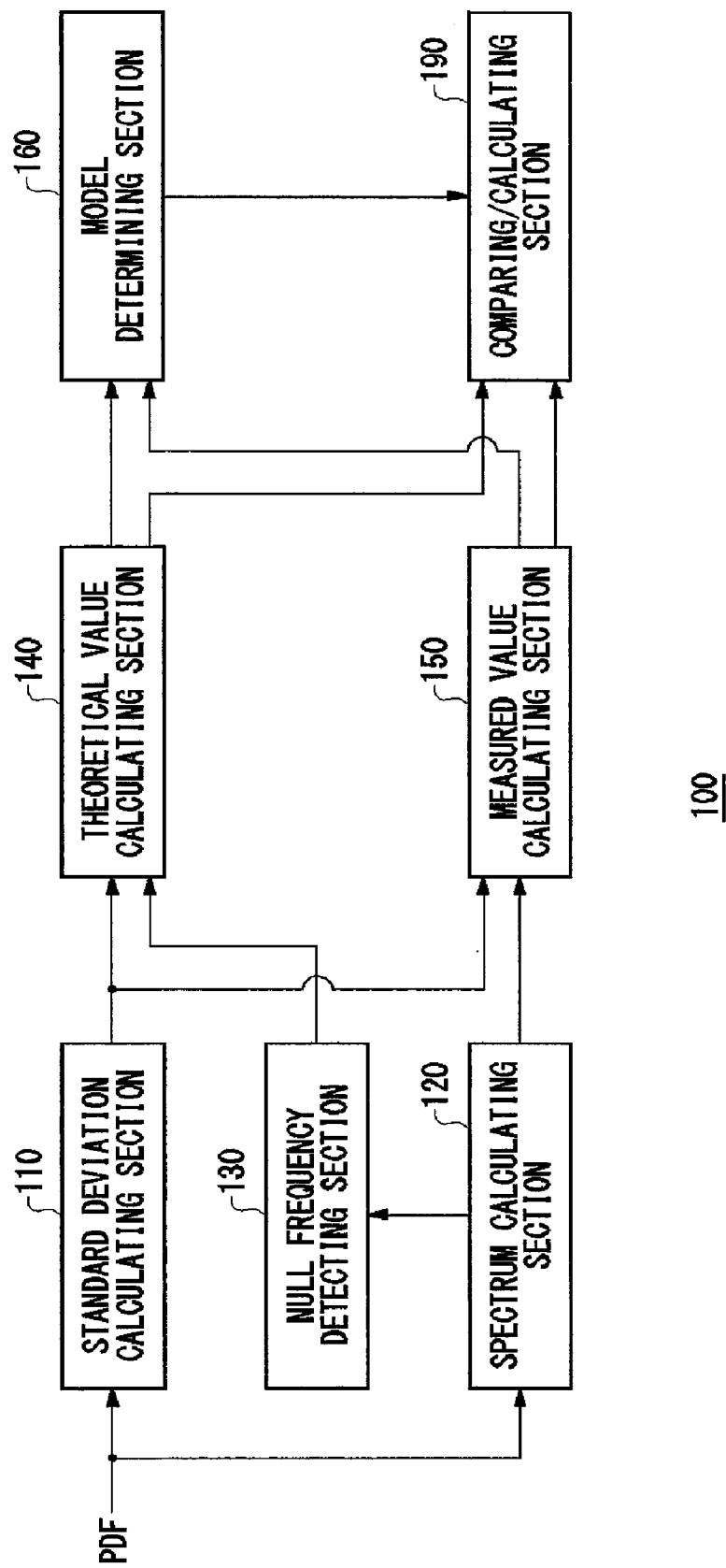
FIG. 25 shows another exemplary configuration of the deterministic component identifying apparatus 100.

FIG. 25 shows another exemplary configuration of the deterministic component identifying apparatus 100. The deterministic component identifying apparatus 100 of the present embodiment is further provided with the ratio calculating section 190 in addition to the configuration of the deterministic component identifying apparatus 100 described in relation to FIG. 13. The ratio calculating section 190 may be the same as the ratio calculating section 190 described in relation to FIG. 23.

The deterministic component identifying apparatus 100 of the present embodiment uses the model determining section 160 to determine whether the deterministic component included in the probability density function follows a trapezoidal distribution. The model determining section 160 may determine whether the model of the deterministic component included in the probability density function is a sinusoidal distribution, a uniform distribution, a dual Dirac distribution, a trapezoidal distribution, or the like. If the model determining section 160 determines that the deterministic component included in the probability density function follows a trapezoidal distribution, the ratio calculating section 190 calculates the trapezoid ratio α of the deterministic component.

In the example described in FIG. 19, the deterministic component model is determined to be a trapezoidal distribution if the measured value is near the theoretical value of a trapezoidal distribution with a trapezoidal ratio of α=0.2. However, the trapezoid ratio α of a trapezoidal distribution can be any value between 0 and 1. Therefore, if the measured value calculated by the measured value calculating section 150 is between the theoretical value of a triangular distribution, which has a trapezoid ratio of α=0, and the theoretical value of a uniform distribution, which has a trapezoid ratio of α=1, the model determining section 160 determines that the model of the deterministic component is a trapezoidal distribution.

As another example, the model determining section 160 determines the deterministic component model to be a trapezoidal distribution if the measured value is near the theoretical value of a trapezoidal distribution having a prescribed trapezoid ratio, such as α=0.5. As a result of the above processes, the model of the deterministic component included in the probability density function can be determined and, if the deterministic component model is a trapezoidal distribution, the trapezoid ratio α of the trapezoidal distribution can be calculated. Therefore, the shape of the distribution of the deterministic component can be accurately identified.

The deterministic component identifying apparatus 100 of the present embodiment may also be provided with the deterministic component calculating section 170 and the random component calculating section 180 described in relation to FIG. 21. In this case, the deterministic component calculating section 170 may further receive the trapezoid ratio α calculated by the ratio calculating section 190. The deterministic component calculating section 170 may use the expressions described in relation to FIG. 18 to calculate the deterministic component based on the type of the deterministic component, the first null frequency $f_{zero}$, and the trapezoidal distribution α.

Figure 26:
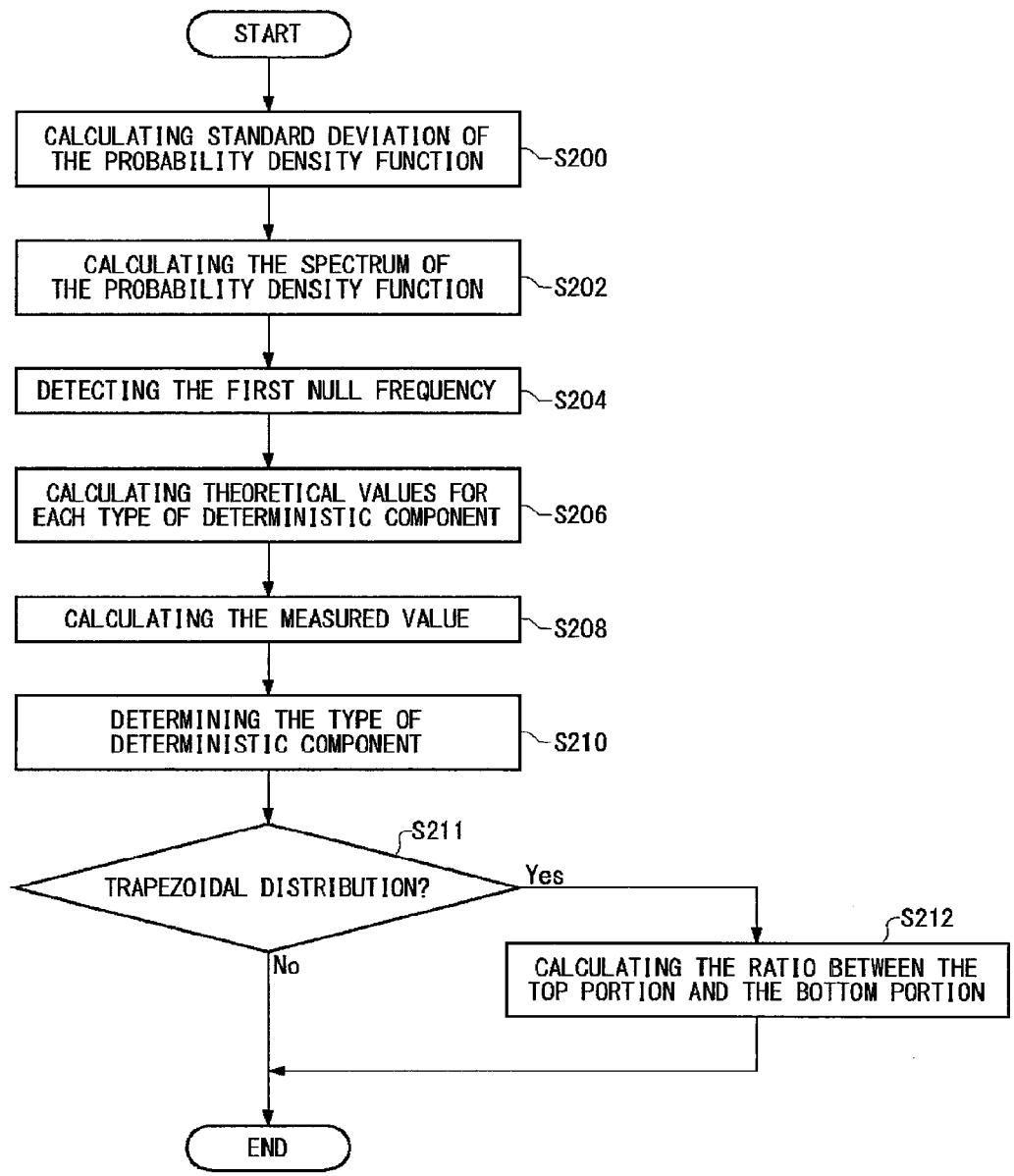
FIG. 26 is a flow chart showing an exemplary operation of the deterministic component identifying apparatus 100 shown in FIG. 25.

FIG. 26 is a flow chart showing an exemplary operation of the deterministic component identifying apparatus 100 shown in FIG. 25. In the present embodiment, the processes from S200 to S210 may be the same as the processes from S200 to S210 described in relation to FIG. 22. After the process of S210, the model determining section 160 determines whether the deterministic component model is a trapezoidal distribution (S211). If the deterministic component model is a trapezoidal distribution, the model determining section 160 informs the ratio calculating section 190 of this fact. If the deterministic component model is not a trapezoidal distribution, the deterministic component identifying apparatus 100 may end the series of processes.

Upon receiving the notification from the model determining section 160, the ratio calculating section 190 calculates the trapezoid ratio α (S212). At this time, the theoretical value calculating section 140 may calculate each theoretical value described in relation to FIG. 23 and supply these theoretical values to the ratio calculating section 190. The ratio calculating section 190 calculates the trapezoid ratio α by comparing the measured value calculated by the measured value calculating section 150 to the theoretical values calculated by the theoretical value calculating section 140. As a result of the processes described above, the model of the deterministic component included in the probability density function can be determined and, if the deterministic component model is a trapezoidal distribution, the trapezoid ratio α of the trapezoidal distribution can be calculated.

Figure 27:
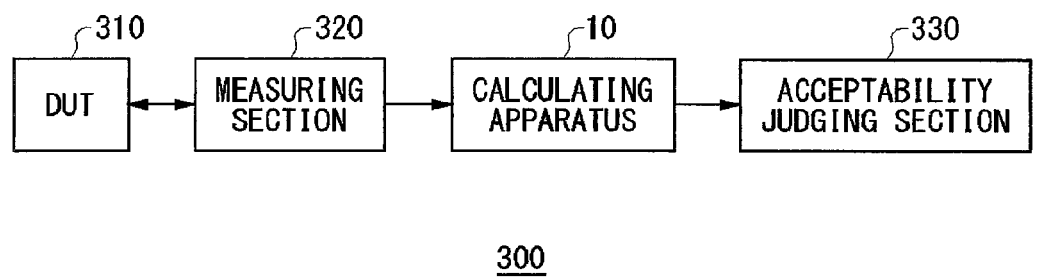
FIG. 27 shows an exemplary configuration of a test system 300 according to an embodiment of the present invention.

FIG. 27 shows an exemplary configuration of a test system 300 according to an embodiment of the present invention. The test system 300 tests a device under test such as a semiconductor circuit or a communication device. The test system 300 includes a measuring section 320, the calculating apparatus 10, and an acceptability judging section 330.

The measuring section 320 measures the jitter or amplitude noise of the target signal from the device under test 310 a plurality of times to generate a probability density function of the jitter or amplitude noise. For example, the measuring section 320 measures the jitter of an electric signal output by the device under test 310, or measures the amplitude noise of the current or voltage of this electric signal.

The calculating apparatus 10 calculates the characteristic of the target signal output from the device under test 310. More specifically, the calculating apparatus 10 calculates a range of sampling timings over which the bit error rate is less than or equal to a prescribed value, i.e. the eye aperture in the time direction, or a bit error rate at a designated sampling timing. The calculating apparatus 10 may instead calculate a range of amplitude values over which the bit error rate is less than or equal to a prescribed value, i.e. the eye aperture in the amplitude direction, or a bit error rate at a designated amplitude value. The calculating apparatus 10 may be the same as the calculating apparatus 10 described in relation to FIG. 1.

The acceptability judging section 330 judges acceptability of the device under test 310 based on the characteristic calculated by the calculating apparatus 10. For example, the acceptability judging section 330 may judge whether the eye aperture or the bit error rate calculated by the calculating apparatus 10 is less than a prescribed specification. The configuration described above enables the test system 300 to accurately judge the acceptability of the device under test 310.

Figure 28:
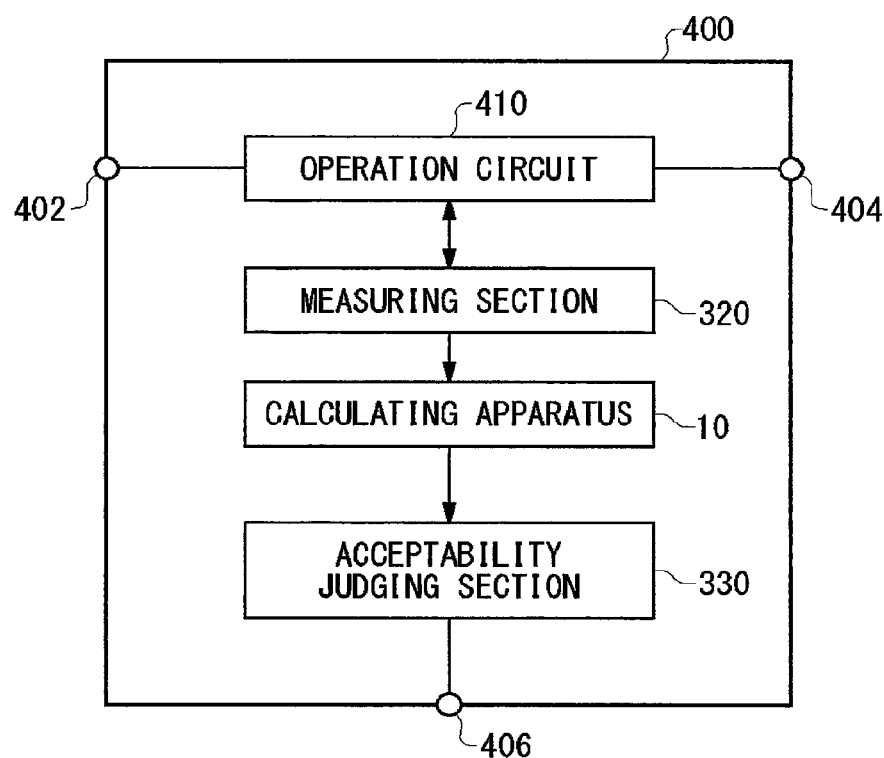
FIG. 28 shows an exemplary configuration of an electronic device 400 according to an embodiment of the present invention.

FIG. 28 shows an exemplary configuration of an electronic device 400 according to an embodiment of the present invention. The electronic device 400 of the present embodiment operates according to a signal supplied form an input pin 402 to output a prescribed generated signal from an output pin 404. The electronic device 400 includes an operation circuit 410, the measuring section 320, the calculating apparatus 10, and the acceptability judging section 330.

The operation circuit 410 operates according to a signal supplied thereto. The operation circuit 410 may generate the prescribed target signal according to a result of the operation, and output the prescribed target signal. The measuring section 320, the calculating apparatus 10, and the acceptability judging section 330 may function as a BIST circuit that tests whether the operation circuit 410 is operating properly.

The measuring section 320 performs a plurality of measurements of the jitter or the amplitude noise of the prescribed target signal generated by the operation circuit 410, to generate a probability density function. The calculating apparatus 10 calculates the characteristic of the prescribed target signal output from the device under test 310, based on the probability density function generated by the measuring section 320. The acceptability judging section 330 judges the acceptability of the operation circuit 410 based on the characteristic calculated by the calculating apparatus 10. The measuring section 320, the calculating apparatus 10, and the acceptability judging section 330 may be the same as the measuring section 320, the calculating apparatus 10, and the acceptability judging section 330 described in relation to FIG. 27.

The acceptability judging section 330 may instead output the acceptability judgment result to the outside via a test pin 406. The configuration described above provides an electronic device 400 that can accurately evaluate an internal operation circuit 410.

Figure 29:
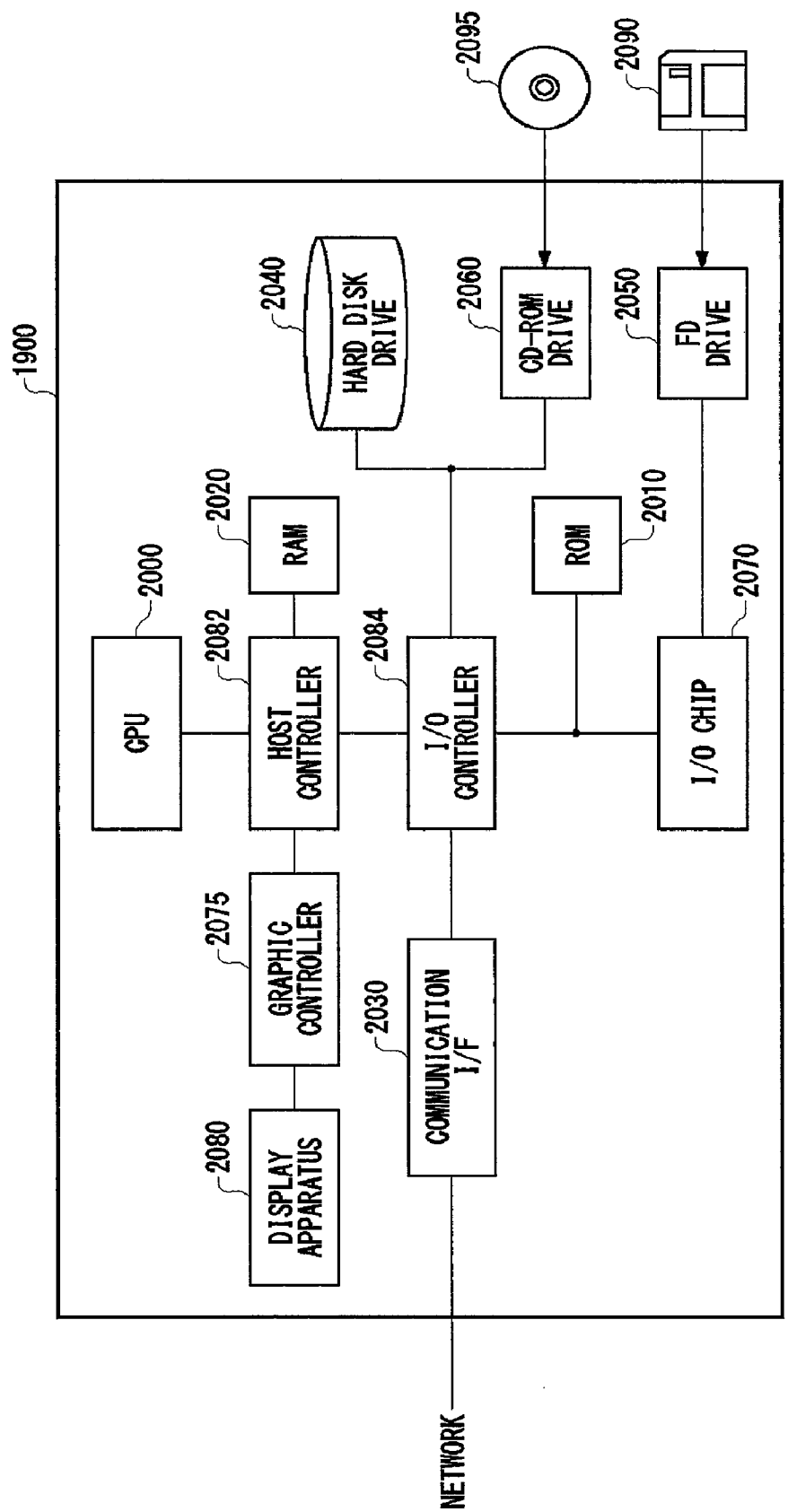
FIG. 29 shows an example of a hardware configuration of a computer 1900 according to an embodiment of the present invention.

FIG. 29 shows an example of a hardware configuration of a computer 1900 according to an embodiment of the present invention. The computer 1900 functions as the calculating apparatus 10 described in relation to FIGS. 1 to 26, based on a program provided thereto. The program may cause the computer 1900 to function as each element of the calculating apparatus 10 described in relation to FIGS. 1 to 26.

The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000. These programs are installed in the computer 1900. These programs prompt the CPU 2000 or the like to make the computer 1900 function as the deterministic component identifying apparatus 100.

The programs shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a deterministic component identifying apparatus that can accurately determine the type of deterministic component included in the probability density function.

What is claimed is:

1. A calculating apparatus that calculates a characteristic of a target signal, comprising:
    an input section that receives an input of either a bit error rate or a sampling timing; and
    a calculating section that calculates a range of sampling timings over which the bit error rate is less than a designated value or a bit error rate at a designated sampling timing,
    wherein the calculating section employs a relational expression between the sampling timing and the bit error rate in a transmission model for transmitting a signal,
    wherein the signal has jitter including a random component and a deterministic component having a prescribed probability density distribution, and
    wherein the relational expression is achieved by substituting, as parameters, a standard deviation of a random component in the jitter of the target signal and a peak-to-peak value of a deterministic component in the jitter of the target signal.

2. The calculating apparatus according to claim 1, wherein the calculating section receives a type of probability density distribution of the deterministic component in the jitter of the target signal, and uses the relational expression in a transmission model for transmitting a signal having jitter that includes the deterministic component having the received type of probability density distribution to calculate the range of sampling timings over which the bit error rate is less than the designated value or the bit error rate at the designated sampling timing.

3. The calculating apparatus according to claim 2, further comprising a model identifying section that identifies the type of probability density distribution of the deterministic component in the jitter of the target signal, based on a probability density function of the jitter of the target signal.

4. The calculating apparatus according to claim 1, further comprising a parameter calculating section that calculates the standard deviation of the random component in the jitter of the target signal and the peak-to-peak value of the deterministic component in the jitter of the target signal, based on a probability density function of the jitter of the target signal.

5. The calculating apparatus according to claim 1, wherein
    when a type of probability density distribution of the deterministic component in the jitter of the target signal is a dual Dirac distribution, the calculating section uses a relational expression shown by Expression 11 to calculate the range of sampling timings over which the bit error rate is less than the designated value or the bit error rate at the designated sampling timing, Expression 11 is defined as $$BER_{DUAL}(t) = 0.5 - \frac{1}{4}\left[\text{erf}\left(\frac{t - \frac{DJ_{P-P}}{2}}{\sqrt{2}\,\sigma_{RJ,RMS}}\right) + \text{erf}\left(\frac{t + \frac{DJ_{P-P}}{2}}{\sqrt{2}\,\sigma_{RJ,RMS}}\right)\right], \quad (11)$$

t represents the sampling timing, $BER_{DUAL}(t)$ represents the bit error rate at the sampling timing t, $\sigma_{RJ,RMS}$ represents the standard deviation of the random component, and $DJ_{P-P}$ presents the peak-to-peak value of the deterministic component, and $$\text{erf}(x) \text{ is defined as } \text{erf}(x) = \frac{2}{\sqrt{\pi}} \int_0^x \exp(-t^2)\,dt.$$

6. The calculating apparatus according to claim 1, wherein
    when a type of probability density distribution of the deterministic component in the jitter of the target signal is a uniform distribution, the calculating section uses a relational expression shown by Expression 12 to calculate the range of sampling timings over which the bit error rate is less than the designated value or the bit error rate at the designated sampling timing, Expression 12 is defined as $$BER_{Uniform}(t) = 0.5 - \frac{\sigma_{RJ,RMS}}{\sqrt{2\pi} \, DJ_{P-P}} \left[ \exp\left(-\frac{\left(t + \frac{DJ_{P-P}}{2}\right)^2}{2\sigma_{RJ,RMS}^2}\right) - \exp\left(-\frac{\left(t - \frac{DJ_{P-P}}{2}\right)^2}{2\sigma_{RJ,RMS}^2}\right) \right] \quad (12)$$

$$- \frac{1}{2DJ_{P-P}} \left[ \left(t + \frac{DJ_{P-P}}{2}\right) \cdot \mathrm{erf}\left(\frac{t + \frac{DJ_{P-P}}{2}}{\sqrt{2}\,\sigma_{RJ,RMS}}\right) - \left(t - \frac{DJ_{P-P}}{2}\right) \cdot \mathrm{erf}\left(\frac{t - \frac{DJ_{P-P}}{2}}{\sqrt{2}\,\sigma_{RJ,RMS}}\right) \right]$$

t represents the sampling timing, $BER_{Uniform}(t)$ represents the bit error rate at the sampling timing t, $\sigma_{RJ,RMS}$ represents the standard deviation of the random component, and $DJ_{P-P}$ represents the peak-to-peak value of the deterministic component, and $$\mathrm{erf}(x) \text{ is defined as } \mathrm{erf}(x) = \frac{2}{\sqrt{\pi}} \int_0^x \exp(-t^2)\,dt.$$

7. The calculating apparatus according to claim 1, wherein when a type of probability density distribution of the deterministic component in the jitter of the target signal is a trapezoidal distribution, the calculating section uses a relational expression shown by Expression 13 to calculate the range of sampling timings over which the bit error rate is less than the designated value or the bit error rate at the designated sampling timing, Expression 13 is defined as $$BER_{Trapez}(t) = 0.5 - f_1(t) - f_2(t) + f_3(t) + f_4(t) \quad (13),$$

t represents the sampling timing and $BERT_{Trapez}(t)$ represents the bit error rate at the sampling timing t,
$f_1(t)$, $f_2(t)$, $f_3(t)$, and $f_4(t)$ are expressed as $$f_1(t) = \frac{\left[\sigma_{RJ,RMS}(2t + DJ_{P-P})\exp\left(-\left(\frac{2t + DJ_{P-P}}{2\sqrt{2}\,\sigma_{RJ,RMS}}\right)^2\right)\right]}{\sqrt{2\pi}\,DJ_{P-P}^2(1-\alpha^2)} +$$

$$\frac{\left[(4\sigma_{RJ,RMS}^2 + (2t + DJ_{P-P})^2) \cdot \mathrm{erf}\left(\frac{2t + DJ_{P-P}}{2\sqrt{2}\,\sigma_{RJ,RMS}}\right)\right]}{4DJ_{P-P}^2(1-\alpha^2)}$$

$$f_2(t) = \frac{\left[\sigma_{RJ,RMS}(2t - DJ_{P-P})\exp\left(-\left(\frac{2t - DJ_{P-P}}{2\sqrt{2}\,\sigma_{RJ,RMS}}\right)^2\right)\right]}{\sqrt{2\pi}\,DJ_{P-P}^2(1-\alpha^2)} +$$

$$\frac{\left[(4\sigma_{RJ,RMS}^2 + (2t - DJ_{P-P})^2) \cdot \mathrm{erf}\left(\frac{2t - DJ_{P-P}}{2\sqrt{2}\,\sigma_{RJ,RMS}}\right)\right]}{4DJ_{P-P}^2(1-\alpha^2)}$$

$$f_3(t) = \frac{\left[\sigma_{RJ,RMS}(2t + \alpha DJ_{P-P})\exp\left(-\left(\frac{2t + \alpha DJ_{P-P}}{2\sqrt{2}\,\sigma_{RJ,RMS}}\right)^2\right)\right]}{\sqrt{2\pi}\,DJ_{P-P}^2(1-\alpha^2)} +$$

$$\frac{\left[(4\sigma_{RJ,RMS}^2 + (2t + \alpha DJ_{P-P})^2) \cdot \mathrm{erf}\left(\frac{2t + \alpha DJ_{P-P}}{2\sqrt{2}\,\sigma_{RJ,RMS}}\right)\right]}{4DJ_{P-P}^2(1-\alpha^2)}$$

$$f_4(t) = \frac{\left[\sigma_{RJ,RMS}(2t - \alpha DJ_{P-P})\exp\left(-\left(\frac{2t - \alpha DJ_{P-P}}{2\sqrt{2}\,\sigma_{RJ,RMS}}\right)^2\right)\right]}{\sqrt{2\pi}\,DJ_{P-P}^2(1-\alpha^2)} +$$

$$\frac{\left[(4\sigma_{RJ,RMS}^2 + (2t - \alpha DJ_{P-P})^2) \cdot \mathrm{erf}\left(\frac{2t - \alpha DJ_{P-P}}{2\sqrt{2}\,\sigma_{RJ,RMS}}\right)\right]}{4DJ_{P-P}^2(1-\alpha^2)}$$

$\sigma_{RJ,RMS}$ represents the standard deviation of the random component, $DJ_{P-P}$ represents the peak-to-peak value of the deterministic component, and $\alpha$ represents a ratio of a length of a top portion to a length of a bottom portion of the trapezoidal distribution, and $$\mathrm{erf}(x) \text{ is defined as } \mathrm{erf}(x) = \frac{2}{\sqrt{\pi}} \int_0^x \exp(-t^2)\,dt.$$

8. A method for calculating a characteristic of a target signal, comprising:
receiving an input of either a bit error rate or a sampling timing; and
calculating one of a range of sampling timings over which the bit error rate is less than a designated value and a bit error rate at a designated sampling timing,
wherein the calculating employs a relational expression between the sampling timing and the bit error rate in a transmission model for transmitting a signal,
wherein the signal has jitter including a random component and a deterministic component having a prescribed probability density distribution, and
wherein the relational expression is achieved by substituting, as parameters, a standard deviation of a random component in jitter of the target signal and a peak-to-peak value of a deterministic component in the jitter of the target signal.

9. A recording medium for storing a program that, when executed by a computer, causes the computer to calculate a characteristic of a target signal comprising:
an input section that receives an input of either a bit error rate or a sampling timing; and
a calculating section that calculates a range of sampling timings over which the bit error rate is less than a designated value or a bit error rate at the designated sampling timing by using a relational expression between the sampling timing and the bit error rate in a transmission model for transmitting a signal,
wherein the signal has jitter including a random component and a deterministic component having a prescribed probability density distribution, and
wherein the relational expression is achieved by substituting, as parameters, a standard deviation of a random component in jitter of the target signal and a peak-to-peak value of a deterministic component in the jitter of the target signal.

10. A test system that tests a device under test, comprising:
- a measuring section that measures, a plurality of times, jitter of a target signal output by the device under test;
- a calculating apparatus that calculates a characteristic of the target signal; and
- an acceptability judging section that judges acceptability of the device under test based on the characteristic calculated by the calculating apparatus, wherein the calculating apparatus includes:
  - a model identifying section that identifies a type of probability density distribution of a deterministic component in the jitter of the target signal, based on a probability density function of the jitter of the target signal;
  - a parameter calculating section that calculates a standard deviation of a random component in the jitter of the target signal and a peak-to-peak value of the deterministic component in the jitter of the target signal, based on the probability density function of the jitter of the target signal;
  - an input section that receives an input of either a bit error rate or a sampling timing; and
  - a calculating section that calculates a range of sampling timings over which the bit error rate is less than a designated value or a bit error rate at the designated sampling timing by using a relational expression between the sampling timing and the bit error rate in a transmission model for transmitting a signal
- wherein the signal has a jitter that includes a random component and a deterministic component having a prescribed probability density distribution, and
- wherein the relational expression is achieved by substituting, as parameters, the standard deviation of the random component in the jitter of the target signal and the peak-to-peak value of the deterministic component in the jitter of the target signal.

11. An electronic device that generates a target signal, comprising:
- an operation circuit that generates and outputs the target signal;
- a measuring section that measures, a plurality of times, jitter of the target signal output by the operation circuit;
- a calculating apparatus that calculates a characteristic of the target signal; and
- an acceptability judging section that judges acceptability of the operation circuit based on the characteristic calculated by the calculating apparatus, wherein the calculating apparatus includes:
  - a model identifying section that identifies a type of probability density distribution of a deterministic component in the jitter of the target signal, based on a probability density function of the jitter of the target signal;
  - a parameter calculating section that calculates a standard deviation of a random component in the jitter of the target signal and a peak-to-peak value of the deterministic component in the jitter of the target signal, based on the probability density function of the jitter of the target signal;
  - an input section that receives an input of either a bit error rate or a sampling timing; and
  - a calculating section that calculates a range of sampling timings over which the bit error rate is less than a designated value or a bit error rate at the designated sampling timing by using a relational expression between the sampling timing and the bit error rate in a transmission model for transmitting a signal,
- wherein the signal has a jitter that includes a random component and a deterministic component having a prescribed distribution, and
- wherein the relational expression is achieved by substituting, as parameters, the standard deviation of the random component in the jitter of the target signal and the peak-to-peak value of the deterministic component in the jitter of the target signal.

* * * * *